(12) United States Patent
Liang et al.

(10) Patent No.: US 8,859,405 B2
(45) Date of Patent: Oct. 14, 2014

(54) METHOD OF FABRICATING HIGH EFFICIENCY CIGS SOLAR CELLS

(71) Applicant: Intermolecular, Inc., San Jose, CA (US)

(72) Inventors: Haifan Liang, Fremont, CA (US); Sang Lee, San Jose, CA (US); Wei Liu, Sunnyvale, CA (US); Sandeep Nijhawan, Los Altos, CA (US); Jeroen Van Duren, Palo Alto, CA (US)

(73) Assignee: Intermolecular, Inc., San Jose, CA (US)

( * ) Notice: Subject to any disclaimer, the term of this patent is extended or adjusted under 35 U.S.C. 154(b) by 380 days.

(21) Appl. No.: 13/711,860

(22) Filed: Dec. 12, 2012

(65) Prior Publication Data

US 2013/0309804 A1 Nov. 21, 2013

Related U.S. Application Data

(63) Continuation of application No. 13/595,730, filed on Aug. 27, 2012, now Pat. No. 8,586,457.

(60) Provisional application No. 61/648,466, filed on May 17, 2012.

(51) Int. Cl.
| | |
|---|---|
| H01L 21/20 | (2006.01) |
| H01L 21/36 | (2006.01) |
| H01L 33/00 | (2010.01) |
| H01L 31/18 | (2006.01) |
| H01L 31/065 | (2012.01) |

(52) U.S. Cl.
CPC .............. H01L 31/065 (2013.01); H01L 31/18 (2013.01); H01L 31/1864 (2013.01); Y02E 10/50 (2013.01)
USPC ........................................................ 438/509

(58) Field of Classification Search
USPC ........................................................ 438/509
See application file for complete search history.

(56) References Cited

U.S. PATENT DOCUMENTS

| | | | | |
|---|---|---|---|---|
| 2002/0106873 | A1* | 8/2002 | Beck et al. | 438/482 |
| 2010/0210065 | A1* | 8/2010 | Aida et al. | 438/95 |
| 2012/0018828 | A1* | 1/2012 | Shao | 257/431 |
| 2012/0094428 | A1* | 4/2012 | Park | 438/93 |
| 2012/0094429 | A1* | 4/2012 | Juliano et al. | 438/95 |
| 2012/0258562 | A1* | 10/2012 | Hakuma et al. | 438/69 |
| 2013/0056054 | A1* | 3/2013 | Liang | 136/256 |
| 2013/0081688 | A1* | 4/2013 | Liang et al. | 136/256 |
| 2013/0095600 | A1* | 4/2013 | Kim et al. | 438/87 |
| 2013/0109126 | A1* | 5/2013 | Van Duren et al. | 438/71 |
| 2013/0109131 | A1* | 5/2013 | Liang | 438/95 |
| 2013/0122642 | A1* | 5/2013 | Liang | 438/95 |
| 2013/0143355 | A1* | 6/2013 | Van Duren et al. | 438/98 |
| 2013/0164886 | A1* | 6/2013 | Liang et al. | 438/95 |

(Continued)

OTHER PUBLICATIONS

Sanchez, D. "Non-Silicon Thin-Film PV Materials Progress and Challenges" SolarCon presentation posted online at http://www.docstoc.com/docs/95111848/Non-Silicon-Thin-Film-PV-Materials-Progress-PV-Materials-Progress as of Sep. 17, 2011 pp. 1-25.*

Primary Examiner — Yu-Hsi D Sun
Assistant Examiner — Grant Withers

(57) ABSTRACT

A method for fabricating high efficiency CIGS solar cells including the deposition of Ga concentrations (Ga/(Ga+In) =0.25–0.66) from sputtering targets containing Ga concentrations between about 25 atomic % and about 66 atomic %. Further, the method includes a high temperature selenization process integrated with a high temperature anneal process that results in high efficiency.

19 Claims, 33 Drawing Sheets

(56) References Cited

U.S. PATENT DOCUMENTS

| | | | |
|---|---|---|---|
| 2013/0280853 A1* | 10/2013 | Avachat et al. | 438/80 |
| 2013/0309804 A1* | 11/2013 | Liang et al. | 438/87 |
| 2013/0309805 A1* | 11/2013 | Liang et al. | 438/87 |
| 2013/0309850 A1* | 11/2013 | Liang et al. | 438/509 |
| 2013/0344646 A1* | 12/2013 | Liang et al. | 438/95 |
| 2014/0038345 A1* | 2/2014 | Liang | 438/95 |
| 2014/0113403 A1* | 4/2014 | Van Duren et al. | 438/95 |
| 2014/0134785 A1* | 5/2014 | Wieting | 438/95 |
| 2014/0158190 A1* | 6/2014 | Liang et al. | 136/255 |
| 2014/0162397 A1* | 6/2014 | Van Duren | 438/95 |
| 2014/0170802 A1* | 6/2014 | Liang | 438/84 |
| 2014/0170803 A1* | 6/2014 | Sapirman et al. | 438/87 |
| 2014/0186995 A1* | 7/2014 | Liang, Haifan | 438/102 |
| 2014/0193939 A1* | 7/2014 | Teng et al. | 438/61 |
| 2014/0193943 A1* | 7/2014 | Lin et al. | 438/95 |

* cited by examiner

| ID | at.-% Cu (or Cu+Ag) | at.-% Ga | at.-% In |
|---|---|---|---|
| 1 | 33.33 | 66.67 | 0.00 |
| 2 | 59.26 | 40.47 | 0.00 |
| 3 | 60.00 | 40.00 | 0.00 |
| 4 | 64.29 | 35.71 | 0.00 |
| 5 | 65.00 | 35.00 | 0.00 |
| 6 | 68.00 | 32.00 | 0.00 |
| 7 | 69.23 | 30.77 | 0.00 |
| 8 | 75.00 | 25.00 | 0.00 |
| 9 | 69.23 | 23.08 | 7.69 |
| 10 | 55.00 | 15.75 | 29.25 |
| 11 | 55.00 | 20.25 | 24.75 |
| 12 | 55.00 | 24.75 | 20.25 |
| 13 | 45.95 | 13.51 | 40.54 |
| 14 | 45.95 | 18.92 | 35.14 |
| 15 | 45.95 | 24.32 | 29.73 |
| 16 | 45.36 | 16.39 | 38.25 |

FIG. 8

| ID | Deposition #1 | Deposition #2 | Deposition #3 |
|---|---|---|---|
| 1 | In<br>PVD, Evap, Plating, etc. | Cu<br>PVD, Evap, Plating, etc. | Cu-Ga<br>Ga = .25 - .66<br>PVD |
| 2 | Cu<br>PVD, Evap, Plating, etc. | In<br>PVD, Evap, Plating, etc. | Cu-Ga<br>Ga = .25 - .66<br>PVD |
| 3 | Cu-Ga<br>Ga = .25 - .66<br>PVD | In<br>PVD, Evap, Plating, etc. | Cu<br>PVD, Evap, Plating, etc. |
| 4 | Cu-In<br>PVD | Cu-Ga<br>Ga = .25 - .66<br>PVD | Optional |
| 5 | Cu-Ga<br>Ga = .25 - .66<br>PVD | Cu-In<br>PVD | Optional |
| 6 | Cu-In-Ga<br>Ga/(Ga + In) = .25 - .66<br>PVD | Optional | Optional |

FIG. 10

| | |
|---|---|
| Area($cm^2$) | 0.435 |
| Efficiency(%) | 16.8 |
| $V_{oc}$(V) | 0.693 |
| $J_{sc}$(mA/$cm^2$) | 31.2 |
| FF(%) | 77.6 |
| $J_0$(mA/$cm^2$) | 1.34e-7 (1.83e-7) |
| A | 1.39 (1.42) |
| $R_s$($\Omega$-$cm^2$) | 0.55 (0.54) |
| $R_{sh}$($\Omega$-$cm^2$) | 2998 |

FIG. 28

METHOD OF FABRICATING HIGH EFFICIENCY CIGS SOLAR CELLS

CROSS-REFERENCE TO RELATED APPLICATION

This application is a Continuation Application of U.S. patent application Ser. No. 13/595,730, filed on Aug. 27, 2012, which claims priority to U.S. Provisional Patent Application Ser. No. 61/648,466 filed on May 17, 2012, each of which is herein incorporated by reference for all purposes.

FIELD OF THE DISCLOSURE

This disclosure relates to thin film photovoltaic devices, and more particularly, to an absorber layer for a thin film photovoltaic device that has a graded bandgap, and methods of forming the same. More specifically, methods of developing absorbers for copper indium gallium (sulfide) selenide (CIG(S)Se, or CIGS) solar cells are discussed.

BACKGROUND OF THE DISCLOSURE

Solar cells are photovoltaic (PV) devices that convert light into electrical energy. Solar cells have been developed as clean, renewable energy sources to meet growing demand. Solar cells have been implemented in a wide number of commercial markets including residential rooftops, commercial rooftops, utility-scale PV projects, building integrated PV (BIPV), building applied PV (BAPV), PV in electronic devices, PV in clothing, etc. Currently, crystalline silicon solar cells (both mono-crystalline and multi-crystalline) are the dominant technologies in the market. Crystalline silicon (cSi) solar cells must use a thick substrate (>100 um) of silicon to absorb the sunlight since it has an indirect bandgap and low absorption coefficient. The use of a thick substrate also means that the crystalline silicon solar cells must use high quality material to provide long carrier lifetimes. Therefore, crystalline silicon solar cell technologies lead to increased costs. Thin film photovoltaic (TFPV) solar devices based on amorphous silicon (a-Si), CIGS, cadmium telluride (CdTe), copper zinc tin sulfide (CZTS), etc. provide an opportunity to increase the material utilization since only thin films (<10 um) are generally required. The thin film solar cells may be formed from amorphous, nanocrystalline, micromorph, micro-crystalline, polycrystalline, or mono-crystalline materials. TFPV devices may include a single absorber layer for converting light into electricity, or multiple absorber layers with tuned absorption spectra for converting light into electricity in a tandem configuration. The tandem configuration might be a two-terminal device, or a multi-terminal (e.g. four-terminal) device structure. The multi-terminal device structure might be comprised of one stack of layers on one substrate, or involve different stacks of layers on multiple stacked substrates.

TFPV devices provide an opportunity to reduce energy payback time, and reduce water usage for solar panel manufacturing. Typical CdTe and CZTS films have bandgaps of about 1.5 eV and therefore, are an ideal match for the AM1.5G solar spectrum to allow for high efficiencies. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire solar spectrum. The absorption coefficient for CIGS is also about $10^5$/cm. Among the thin film solar technologies, CIGS has demonstrated the best lab cell efficiency (over 20%) and the best large area module efficiency (>15%).

A class of PV absorber films of special interest is formed as CIGS-type IB-IIA-VIA multinary chalcogenide compounds from Groups IB, IIIA, and VIA of the periodic table. Group IB includes Cu, Ag, and Au. Group IIIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VIII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, Cl, Br, I, and At. Other potential absorber materials of interest include kesterites like CZTS, cuprous oxide, iron sulfide, tungsten sulfide, calcium nitride, zinc phosphide, barium silicide, etc.

TFPV devices can be fabricated at the cell level or the panel level, thus further decreasing the manufacturing costs. As used herein, the cell level is understood to mean an individual unit that can be combined with other units to form a module. The cells may be rigid or flexible. As used herein, the panel level is understood to mean a large TFPV structure that is not composed of smaller units. Generally, the panels are similar in size to the aforementioned modules. For economy of language, the phrase "TFPV device" will be understood to refer to either a solar cell or a panel without distinction. Furthermore, TFPV devices may be fabricated on inexpensive substrates such as glass, plastics, and thin sheets of metal. Examples of suitable substrates comprise float glass, low-iron glass, borosilicate glass, flexible glass, flexible ceramics, specialty glass for high temperature processing, stainless steel, carbon steel, aluminum, cladded foils, copper, polyimide, plastics, etc. Furthermore, the substrates may be processed in many configurations such as single substrate processing, multiple substrate batch processing, in-line continuous processing, roll-to-roll processing, etc.

The increasing demand for environmentally friendly, sustainable and renewable energy sources is driving the development of large area, thin film photovoltaic devices. With a long-term goal of providing a significant percentage of global energy demand, there is a concomitant need for Earth-abundant, high conversion efficiency materials for use in photovoltaic devices. A number of Earth abundant, direct-bandgap semiconductor materials now seem to show evidence of the potential for both high efficiency and low cost in Very Large Scale (VLS) production (e.g. greater than 100 gigawatt (GW)), yet their development and characterization remains difficult because of the complexity of the materials systems involved.

Among the TFPV technologies, CIGS and CdTe are the two that have reached volume production with greater than 11% stabilized module efficiencies. However, the supply of In, Ga and Te may impact annual production of CIGS and CdTe solar panels. Moreover, price increases and supply constraints in Ga and In could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly materials should be considered a top priority for research. The knowledge and infrastructure developed around CdTe and CIGS TFPV technologies can be leveraged to allow faster adoption of new TFPV materials systems.

The development of TFPV devices exploiting Earth abundant materials represents a daunting challenge in terms of the time-to-commercialization. That same development also suggests an enticing opportunity for breakthrough discoveries. A quaternary system such as CIGS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-)electronically-active device is extremely sensitive to its interfaces. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

Due to the complexity of the material, cell structure, and manufacturing process, both the fundamental scientific understanding and large scale manufacturability are yet to be realized for TFPV devices. As the photovoltaic industry pushes to achieve grid parity, much faster and broader investigation is needed to explore the material, device, and process windows for higher efficiency and a lower cost of manufacturing process. Efficient methods for forming different types of TFPV devices that can be evaluated are necessary.

In light of the above, there is a need in the art for an economical method of creating CIGS absorber layers having a graded bandgap. A graded bandgap allows for higher efficiency CIGS solar cells.

SUMMARY OF THE DISCLOSURE

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments of the present invention, Cu—In—Ga precursor films are deposited from sputtering targets wherein the Ga concentration in one or more target(s) is between about 25 atomic % and about 66 atomic %. The deposition may be performed in a batch or in-line deposition system. If an in-line deposition system is used, the movement of the substrates through the system may be continuous or may follow a "stop and soak" method of substrate transport.

In some embodiments of the present invention, the Cu—In—Ga precursor films are chalcogenized (i.e. selenized and/or sulfurized) in a batch furnace wherein the chalcogenization process includes several temperature steps. The reactive atmosphere (i.e. concentration of the Se-containing gas and/or S-containing gas) varies among the various temperature steps. The pressure may be reduced or increased relative to atmospheric pressure during the various temperature steps. A high temperature anneal may be included at the end of the chalcogenization process to improve the efficiency of the solar cell made with the absorber layer.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 8 is a table of potential target compositions according to some embodiments.

FIG. 10 is a table of potential deposition sequences according to some embodiments.

FIG. 28 presents a table of I-V parameters and data for a CIGSe solar cell according to some embodiments.

DETAILED DESCRIPTION

Figure 1:
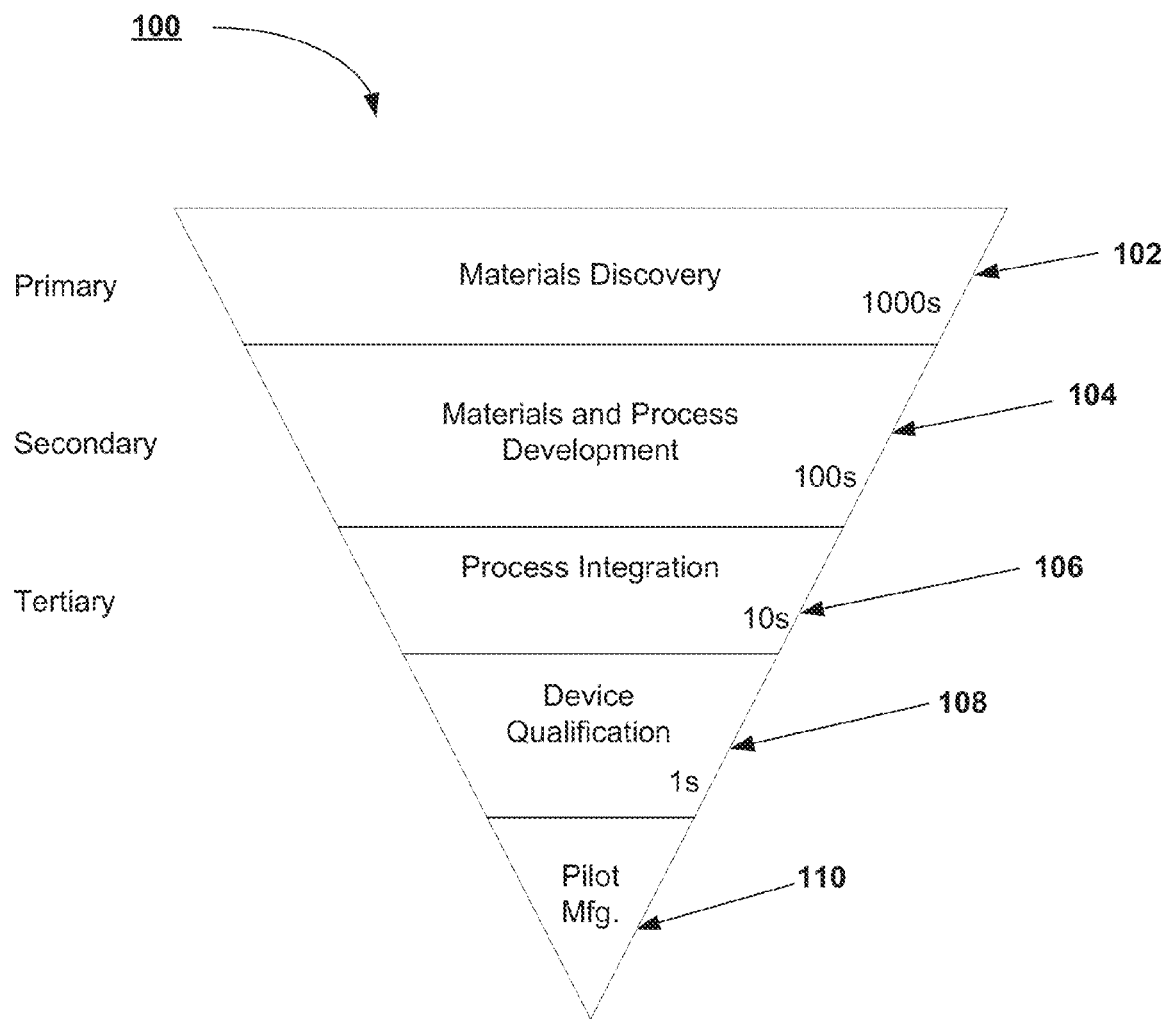
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "GIGS" will be understood to represent the entire range of related alloys denoted by $Cu_z In_{(1-x)} Ga_x S_{(2+w)(1-y)} Se_{(2+w)y}$, where $0.5 \leq z \leq 1.5$, $0 \leq x \leq 1$, $0 \leq y \leq 1$, $-0.2 \leq w \leq 0.5$. Similarly, as noted above, other materials (i.e. Ag, Au, Te, etc.) may be incorporated into potential absorber layers, (with e.g. Ag replacing part or all of the Cu, and Te replacing part or all of the Se and/or S). Also as mentioned previously, any of these materials may be further doped with a suitable dopant. As used herein, "CIGSSe", "CIGSe", and "CIGS" will be defined as equivalent and will be used interchangeably and will include all compositions including Cu—In—Ga—Se—S, Cu—In—Ga—Se, and Cu—In—Ga—S. Furthermore, "CIGS" also includes other IB-IIIA-VIA alloys, like (Ag,Cu)(In,Ga)(Se), or (Cu)(In,Ga)(S,Se,Te), and the like.

As used herein, the notation "(IIIA)" will be understood to represent the sum of the concentrations of all Group-IIIA elements. This notation will be used herein in calculations of the composition ratios of various elements. This notation will be understood to extend to each of the other Groups of the periodic table respectively (e.g. "(IA)", "(IIA)", "(IVA)", "(VIA)", "(IB)", "(IIB)", etc.).

As used herein, the notation "Cu—In—Ga" and "Cu(In, Ga)" will be understood to include a material containing these elements in any ratio. The notation is extendable to other materials and other elemental combinations.

As used herein, the notation "$Cu_x In_y Ga_z$" will be understood to include a material containing these elements in a specific ratio given by x, y, and z (e.g. $Cu_{75} Ga_{25}$ contains 75 atomic % Cu and 25 atomic % Ga). The notation is extendable to other materials and other elemental combinations.

As used herein, the notation "$(Ag,Cu)_x(In,Ga)_y(Se,S,Te)_z$" will be understood to include a material containing a total amount of Group-IB elements (i.e. Ag plus Cu, etc.) in a ratio given by "x", a total amount of Group-IIIA elements (i.e. In plus Ga), etc. in a ratio given by "y", and a total amount of Group-VIA elements (i.e. Se plus S plus Te, etc.) in a ratio given by "z". The notation is extendable to other materials and other elemental combinations.

As used herein, "metal chalcogenide" or "chalcogenide" will be understood to represent the entire range of related compounds denoted by "MX" where M represents one or more metal elements and X represents one or more of the chalcogen elements (e.g. O, S, Se, or Te).

As used herein, "chalcogenize" and "chalcogenization" will be understood to represent the process by which one or more metals are converted to chalcogenide compounds by exposing the one or more metals to a chalcogen (e.g. O, S, Se, or Te) at elevated temperature (e.g. between 100 C and 700 C). Specifically, "selenization" will be understood to represent the process by which one or more metals are converted to selenide compounds by exposing the one or more metals to a Se source at elevated temperature (e.g. between 100 C and 700 C). Specifically, "sulfurization" will be understood to represent the process by which one or more metals are converted to sulfide compounds by exposing the one or more metals to a S source at elevated temperature (e.g. between 100 C and 700 C). In addition, "chalcogenize" or "chalcogenization" will be understood to represent the process by which a metal precursor is either partially or completely converted to the final multinary chalcogenide compound(s). Similarly, "chalcogenize" or "chalcogenization" will be understood to represent the process by which a precursor containing one or more chalcogenide materials with/without one or more elemental or alloy metals is converted to one or more dense, polycrystalline, desired multinary chalcogenide compound(s). It should be understood that the majority of the final film contains the desired multinary chalcogenide compound(s), yet a minority of the material might not be converted to the desired multinary chalcogenide compound(s).

As used herein, the terms "film" and "layer" will be understood to represent a portion of a stack. They will be understood to cover both a single layer as well as a multilayered structure (i.e. a nanolaminate). As used herein, these terms will be used synonymously and will be considered equivalent.

As used herein, "single grading" and "single gradient" will be understood to describe cases wherein a parameter varies throughout the thickness of a film or layer and further exhibits a smooth, quasilinear variation. Examples of suitable parameters used herein will include the atomic concentration of a specific elemental species (i.e. composition variation) throughout the thickness of a film or layer, and bandgap energy variation throughout the thickness of a film or layer.

As used herein, "double grading" and "double gradient" will be understood to describe cases wherein a parameter varies throughout the thickness of a film or layer and further exhibits a variation wherein the value of the parameter is smaller toward the middle of the film or layer with respect to either end of the film or layer. It is not a requirement that the value of the parameter be equivalent at the two ends of the film or layer. Examples of suitable parameters used herein will include the atomic concentration of a specific elemental species (i.e. composition variation) throughout the thickness of a film or layer, and bandgap energy variation throughout the thickness of a film or layer.

As used herein, "substrate configuration" will be understood to describe cases wherein the TFPV stack is built sequentially on top of a substrate and the light is assumed to be incident upon the top of the TFPV stack. As used herein, an "n-substrate" configuration will be used to denote that the n-type layer (i.e. buffer layer) is closest to the incident light. The n-substrate configuration is the most common. As used herein, a "p-substrate" configuration will be used to denote that the p-type layer (i.e. absorber layer) is closest to the incident light.

As used herein, "superstate configuration" will be understood to describe cases wherein the substrate faces the incident sunlight. The convention will be used wherein light is assumed to be incident upon the substrate. As used herein, an "n-superstrate" configuration will be used to denote that the n-type layer (i.e. buffer layer) is closest to the incident light. As used herein, a "p-superstrate" configuration will be used to denote that the p-type layer (i.e. absorber layer) is closest to the incident light.

As used herein, "substrate" will be understood to generally be one of float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. in all of the methods and examples described herein.

As used herein, "precursor layer", "precursor material", "metal precursor layer", "metal precursor material", etc. will be understood to be equivalent and be understood to refer to a metal, metal alloy, metal chalcogenide, etc. layer and/or material that is first deposited and will ultimately become the absorber layer of the TFPV device after full chalcogenization and/or further processing.

As used herein, "absorber layer", "absorber material", etc. will be understood to be equivalent and be understood to refer to a layer and/or material that is responsible for the charge generation in the TFPV device after full chalcogenization and/or further processing.

As used herein, the notations "Al:ZnO" and "ZnO:Al" will be understood to be equivalent and will describe a material wherein the base material is the metal oxide and the element separated by the colon, ":", is considered a dopant. In this example, Al is a dopant in a base material of zinc oxide. The notation is extendable to other materials and other elemental combinations.

As used herein, a "bandgap-increasing metal" will be understood to be a metal element that increases the bandgap when substituted for an element from the same periodic table Group in the absorber material. For example, substituting Ag for a portion of the Cu in a CIGS material will increase the bandgap. For example, increasing the relative amount of Ga versus indium in a CIGS material will increase the bandgap. For example, substituting Ag for a portion of the Cu in a CZTS material will increase the bandgap. For example, substituting Ge for a portion of the Sn in a CZTS material will increase the bandgap.

In various FIGS. below, a TFPV material stack is illustrated using a simple planar structure. Those skilled in the art will appreciate that the description and teachings to follow can be readily applied to any simple or complex TFPV solar cell structure, (e.g. a stack with (non-)conformal non-planar layers for optimized photon management). The drawings are for illustrative purposes only and do not limit the application of the present invention.

"Double grading" the bandgap of the CIGS absorber is a method known in the art to increase the efficiency of CIGS solar cells. In a CIGS absorber layer that has a double-graded bandgap profile, the bandgap of the CIGS layer increases toward the front surface and toward the back surface of the CIGS layer, with a bandgap minimum located in a center region of the CIGS layer. Double grading helps in reducing unwanted charge carrier recombination. The increasing bandgap profile at the back surface of the CIGS layer, (i.e., the absorber surface that is remote from the incident light in the substrate configuration), creates a back surface field, which reduces recombination at the back surface and enhances carrier collection. Generally, in the disclosure to follow, the description will apply to the "n-substrate" configuration for economy of language. However, those skilled in the art will understand that the disclosure is also equally applicable to either of the "p-substrate" or "n, p-superstrate" configurations discussed previously.

Co-evaporation is one technique known in the art for producing a double-graded bandgap in a CIGS absorber layer. The co-evaporation process can produce a "gallium (Ga) rich region" (i.e. increased Ga relative to the center region of the layer) at the front and/or back surfaces of a CIGS absorber layer and a gallium-poor region in the center of the CIGS absorber layer. However, co-evaporation is a relatively complex process that is not as economical or as easily implemented as other deposition processes known in the art. In a 2-step process, Cu—In—Ga metal precursors are deposited first, followed by a second selenization process to form a CIGS absorber layer. The 2-step process is generally more suited to large-scale low-cost manufacturing compared to the co-evaporation process. However, because gallium selenizes slower than indium under otherwise identical conditions, gallium tends to accumulate towards the back surface of the CIGS layer during the selenization process, thereby creating an uncontrolled single grading in the bandgap profile, i.e., the bandgap of the CIGS layer increases from the front surface to the back surface. Double grading of the bandgap profile is then typically achieved by the incorporation of sulfur (S) at the front surface of the CIGS layer for a 2-step process thereby creating CIGSSe. However, sulfur incorporation adds considerable complexity to the growth process and more easily produces a TFPV absorber material (copper-indium-gallium-selenium-sulfur) of lower quality compared to CIGSe without sulfur.

The efficiency of TFPV devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence (s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
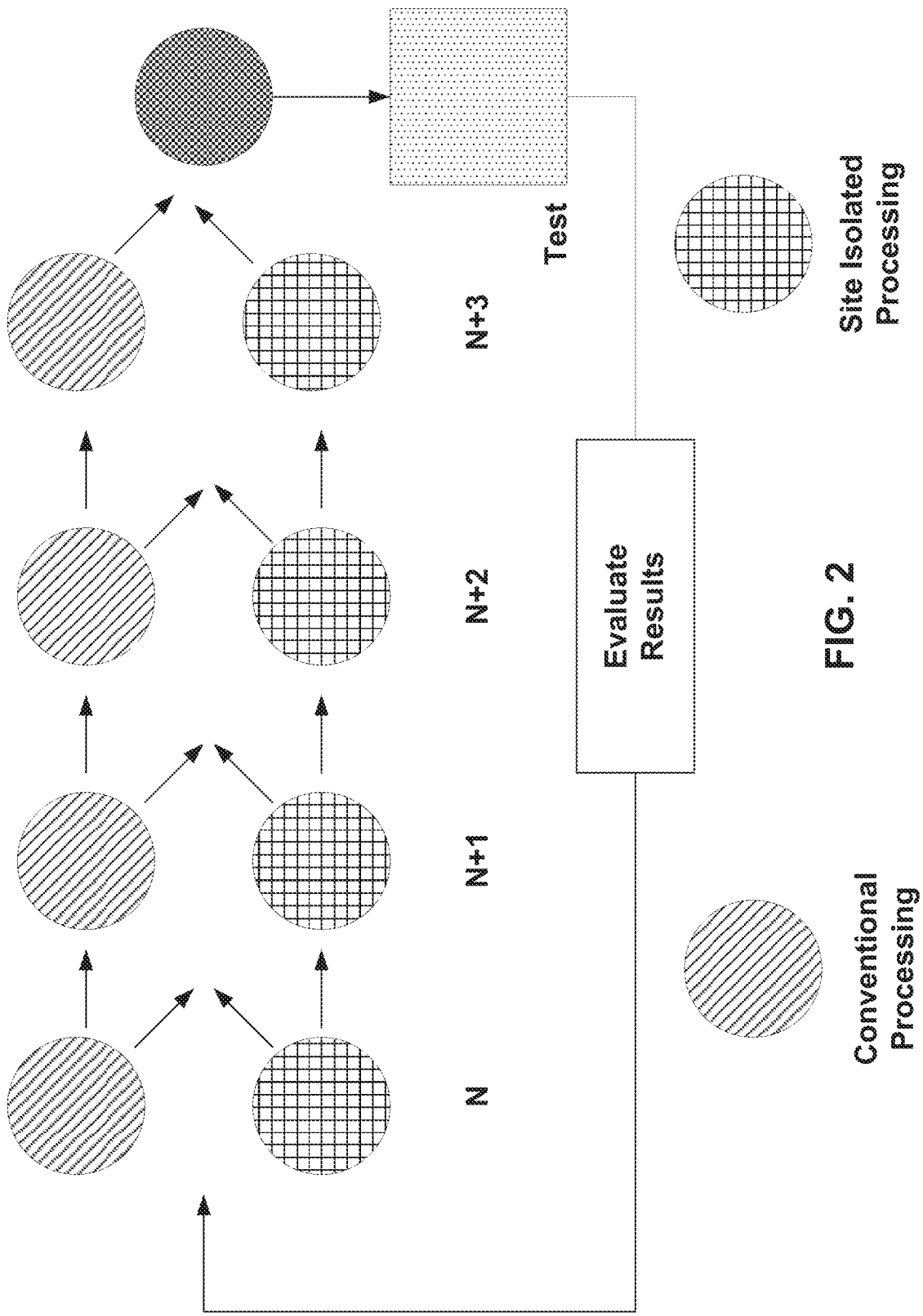
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
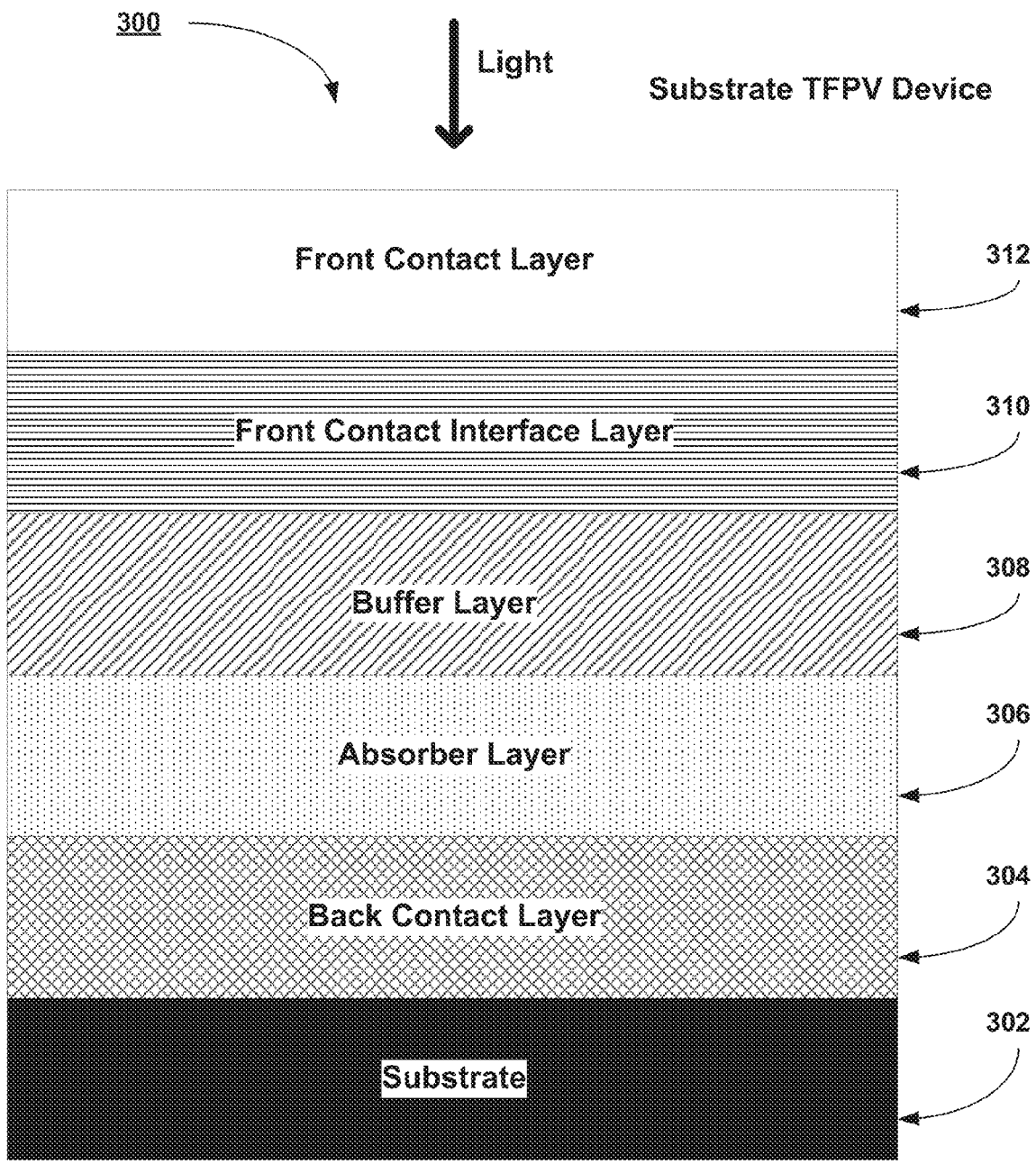
FIG. 3 illustrates a schematic diagram of a simple substrate TFPV stack according to an embodiment described herein.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of a CIGS TFPV device. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CIGS TFPV devices. Other types of TFPV devices use different materials for the back contact. As an example, Cu alloys such as Cu/Au, Cu/graphite, Cu/Mo, Cu:ZnTe, etc. are typically used for CdTe TFPV devices and transparent conductive oxide (TCO) materials such as ZnO, ITO, $SnO_2$:F, etc. are typically used for a-Si TFPV devices. The back contact layer may be formed by any number of deposition technologies. Examples of suitable deposition technologies comprise physical vapor deposition (PVD) (e.g. sputtering), evaporation, chemical vapor deposition (CVD), atomic layer deposition (ALD), plating, printing, wet coating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier and/or adhesion-promotion layer (not shown) may be formed between the substrate and the back contact layer. When implemented, the diffusion barrier layer stops the diffusion of impurities from the substrate into the back contact layer, or alternatively, stops the diffusion and reaction of the back contact material with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed, partially or completely, from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

A p-type absorber layer, 306, of CIGS is then deposited on top of the back contact layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the absorber growth. The Na may be added by out-diffusion from the SLG substrate or may be purposely added in the form of $Na_2Se$, NaF, sodium alloys of In and/or Ga, or another Na source, prior, during, or after the deposition and/or growth of the absorber layer. Optionally, the precursor and/or absorber layer undergoes a selenization process after formation to convert the precursor to CIGS into a high-quality CIGS semiconductor film. The selenization process involves the exposure of the precursor and/or absorber layer to $H_2Se$, $H_2S$, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During the selenization process, a layer of $Mo(S,Se)_2$ (not shown) forms at the back contact/absorber layer interface and forms a fairly good ohmic contact between the two layers. Alternatively, a layer of $Mo(S,Se)_2$ (not shown) can be deposited at the back contact/absorber layer interface using a variety of well known techniques such as PVD (sputtering), CBD, ALD, plating, etc. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, CdZnS, ZnO, Zn(O,S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), InSnO (ITO), InZnO, B:ZnO, Ga:ZnO, F:ZnO, F:SnO$_2$, etc.) is formed on top of the iZnO layer. The top TCO layer is typically between about 0.25 um and 1.0 um in thickness. The top TCO layer is typically formed using a (reactive) PVD (sputtering) technique or CVD technique. Optionally, the transparent top electrode can be printed or wet-coated from (silver) nano-wires, carbon nanotubes, and the like.

Figure 4:
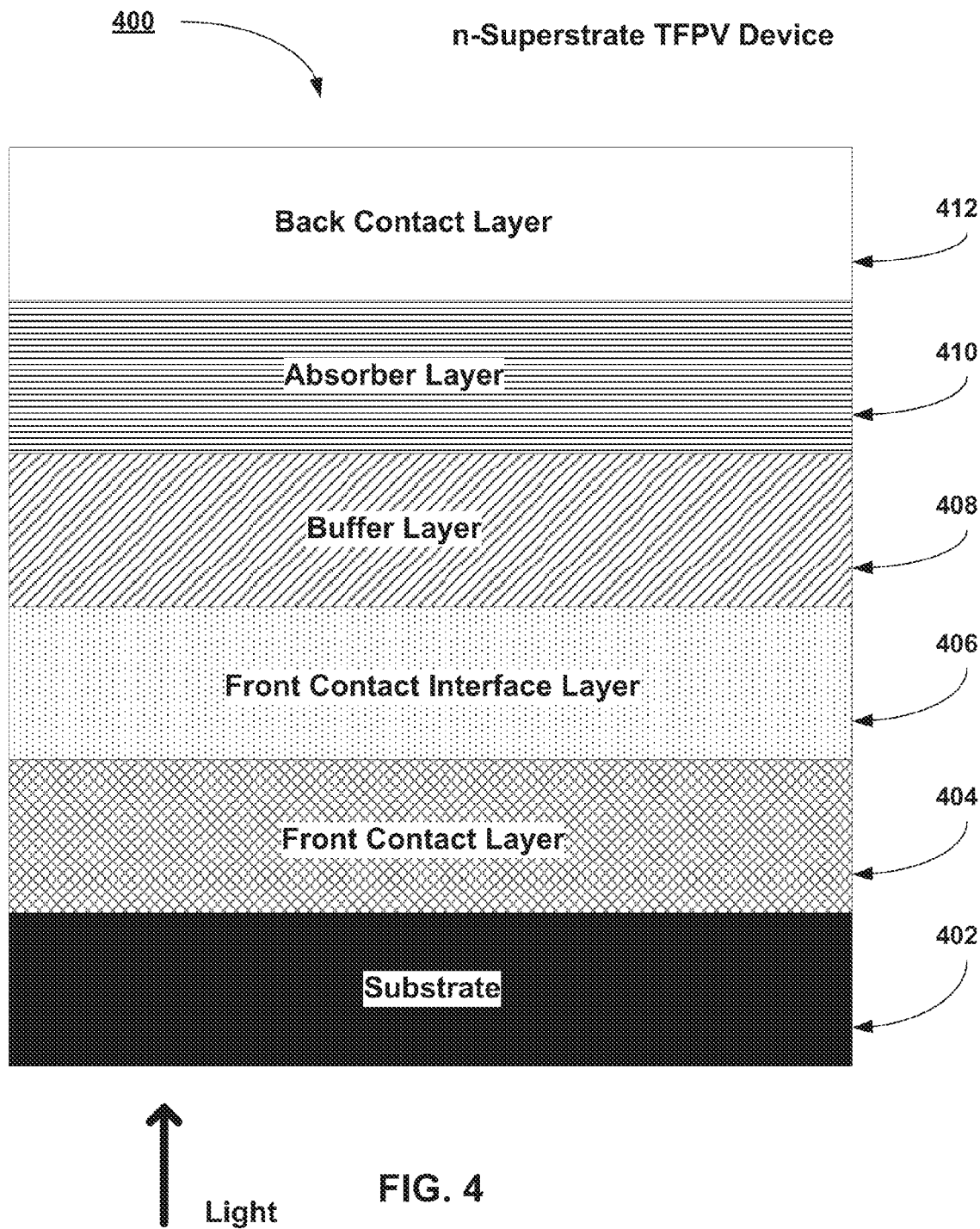
FIG. 4 illustrates a schematic diagram of a simple superstrate TFPV stack according to an embodiment described herein.

FIG. 4 illustrates a simple CIGS TFPV device material stack, 400, consistent with some embodiments of the present invention. The CIGS TFPV device illustrated in FIG. 4 is shown in a superstrate configuration wherein the glass substrate faces the incident sunlight. The convention will be used wherein light is assumed to be incident upon the substrate and material stack as illustrated. As used herein, this configuration will be labeled an "n-superstrate" configuration to denote that the n-type layer (i.e. buffer layer) is closest to the incident light. This label is to distinguish the configuration from an alternate configuration described with respect to FIG. 5 below. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer, 404, (examples include Al:ZnO (AZO), InSnO (ITO), InZnO, B:ZnO, Ga:ZnO, F:ZnO, F:SnO$_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between about 0.3 um and 2.0 um in thickness. The bottom TCO layer is typically formed using a reactive PVD (sputtering) technique or CVD technique.

Optionally, a diffusion barrier and/or adhesion-promotion layer (not shown) may be formed between the substrate, 402, and the front contact layer, 404. When implemented, the diffusion barrier layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier layer composition and thickness are optimized for optical transparency as necessary for the superstrate configuration. The diffusion barrier layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods, such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the iZnO layer, 406. Examples of suitable n-type buffer layers comprise CdS, ZnS, In$_2$S$_3$, In$_2$(S,Se)$_3$, CdZnS, ZnO, Zn(O,S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CIGS is then deposited on top of the buffer layer. The absorber layer may be formed, partially or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of Na$_2$Se or another Na source, prior, during, or after the deposition and/or growth of the absorber layer. Optionally, the precursor and/or absorber layer undergoes a selenization process after formation to convert the precursor to CIGS into a high-quality CIGS semiconductor film. The selenization process involves the exposure of the precursor and/or absorber layer to H$_2$Se, H$_2$S, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary Cu—Ga and In sputter targets. Nevertheless, plating and printing to deposit the metal precursor film containing Cu, In, and/or Ga are used as well. During subsequent processing, a layer of Mo(S,Se)$_2$ (not shown) is formed at the back contact/absorber layer interface and forms a fairly good ohmic contact between the two layers. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS TFPV devices. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

Figure 5:
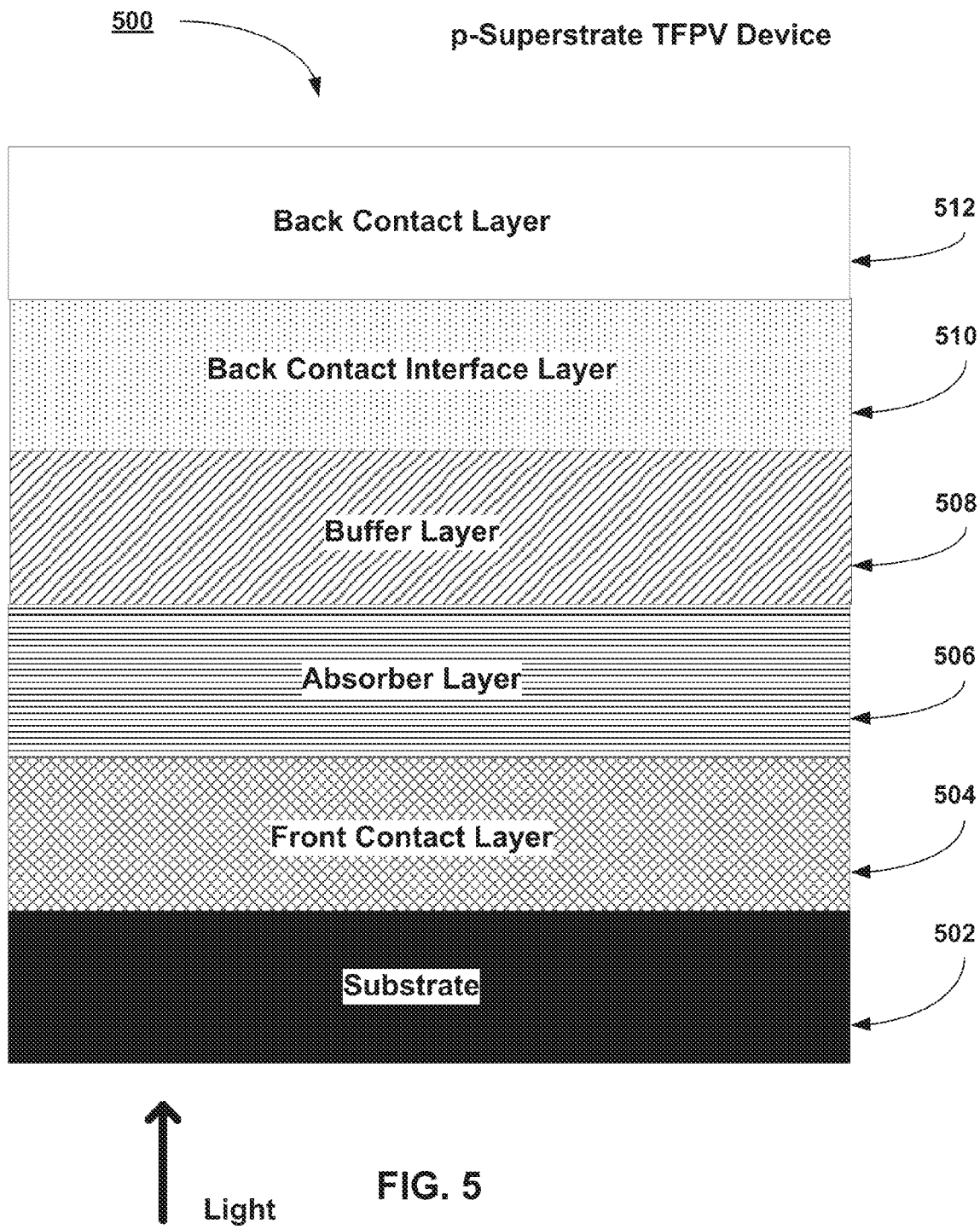
FIG. 5 illustrates a schematic diagram of a simple superstrate TFPV stack according to an embodiment described herein.

FIG. 5 illustrates a simple CIGS TFPV device material stack, 500, consistent with some embodiments of the present invention. The CIGS TFPV device illustrated in FIG. 5 is shown in a superstrate configuration wherein the glass substrate faces the incident sunlight. The convention will be used wherein light is assumed to be incident upon the substrate and material stack as illustrated. As used herein, this configuration will be labeled a "p-superstrate" configuration to denote that the p-type layer (i.e. absorber layer) is closest to the incident light. This label is to distinguish the configuration from the alternate configuration described with respect to FIG. 4 previously. The formation of the CIGS TFPV device will be described starting with the substrate. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, in-line continuous processing, roll-to-roll processing, etc.

A low resistivity bottom TCO front contact layer (examples include Al:ZnO (AZO), InSnO (ITO), InZnO, B:ZnO, Ga:ZnO, F:ZnO, F:$SnO_2$, etc.), 504, is formed on top of the substrate, 502. As used herein, the phrase "front contact" will be understood to be the primary current conductor layer situated between the substrate and the absorber layer in a superstrate configuration TFPV device. The bottom TCO layer is typically between about 0.3 um and 2.0 um in thickness. The bottom TCO layer is typically formed using a reactive PVD (sputtering) technique or CVD technique. The TCO can be a p-type TCO, (e.g. ternary-based oxide in the family of $CO_3O_4$-based spinels, like $Co_2ZnO_4$ and $Co_2NiO_4$). Nevertheless, it should be understood that an n-type TCO with an additional layer (e.g. a heavily-doped p-type semiconductor layer, or $MoSe_2$) between the TCO and the absorber can be used as well. Furthermore, the TCO might be a bi- or multi-layer of an n-type TCO in contact with the substrate, followed by an ultrathin metal layer, (e.g. like Ag), followed by a thin p-type TCO in contact with the absorber layer, with/without an additional $MoSe_2$ layer between the p-type TCO and the absorber layer.

Optionally, a diffusion barrier and/or adhesion-promotion layer (not shown) may be formed between the substrate, 502, and the front contact layer 504. When implemented, the diffusion barrier and/or adhesion-promotion layer stops the diffusion of impurities from the substrate into the TCO, or alternatively, stops the diffusion and reaction of the TCO material and above layers with the substrate. Examples of common diffusion barrier and/or adhesion-promotion layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. It should be understood that the diffusion barrier and/or adhesion-promotion layer composition and thickness are optimized for optical transparency as necessary for the superstrate configuration. The diffusion barrier and/or adhesion-promotion layer may be formed from any well known technique such as sputtering, ALD, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 506, of CIGS is then deposited on top of the front contact layer. The absorber layer may be formed, partially, or completely, using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is present during the growth of the absorber. The Na may be purposely added in the form of $Na_2Se$ or another Na source, prior, during, or after the deposition of the precursor and/or absorber layer. Typically, the precursor and/or absorber layer undergoes a chalcogenization (e.g. selenization) process after formation to convert the precursor to CIGS into a high-quality CIGS semiconductor film. The chalcogenization process involves the exposure of the precursor and/or absorber layer to $H_2Se$, $H_2S$, Se vapor, S vapor, or diethylselenide (DESe) at temperatures most typically between about 300 C and 700 C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 508, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS TFPV devices. The buffer layer may be deposited using chemical bath deposition (CBD), chemical surface deposition (CSD), PVD (sputtering), printing, plating, ALD, Ion-Layer-Gas-Reaction (ILGAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

An intrinsic iZnO layer, 510, is then formed on top of the buffer layer. The iZnO layer is a high resistivity material and forms part of the back contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

A back contact layer, 512, is formed on intrinsic iZnO layer, 510. An example of a suitable back contact layer material is a thin n-type TCO followed by Ni and/or Al. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack (i.e. similar configuration as FIG. 3) might be: substrate/AZO/Mo/CIGS/CdS/iZnO/AZO. As an example, another p-superstrate film stack (i.e. similar configuration as FIG. 5) might be: substrate/barrier/ZnO:Al/Mo/CIGS/CdS/iZnO/ZnO:Al/Al. The detailed film stack configuration is not meant to be limiting, but simply serves as an example of the implementation of embodiments of the present invention.

Figure 6:
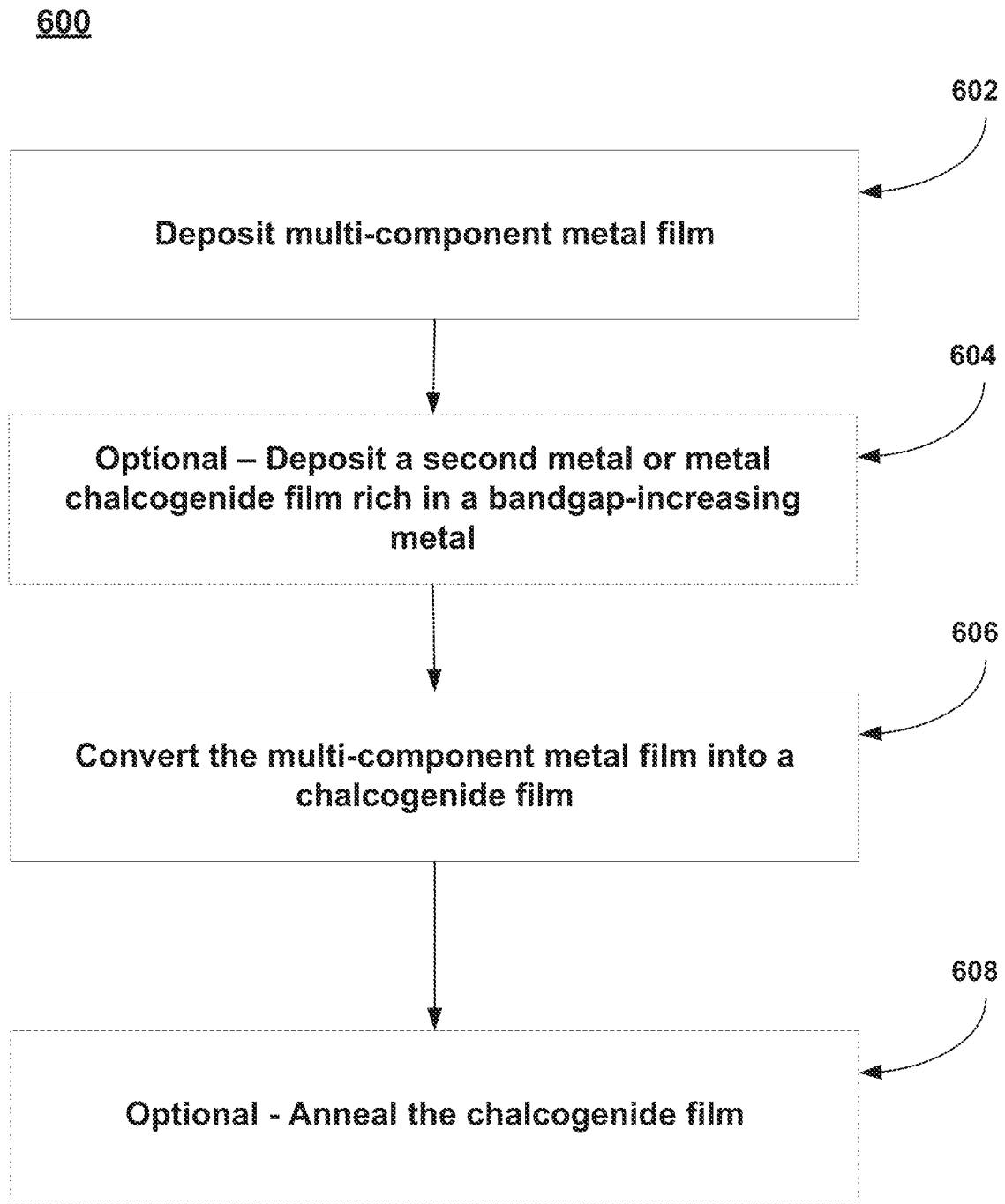
FIG. 6 is a flow chart for a generic 2-step process to form a CIGSe absorber layer.

The formation of the absorber layer is typically a multi-step process. One way of grading CIGS materials is by a 2-step approach as illustrated in FIG. 6. In step 602, "metal precursor" films are deposited. For CIGS-like absorbers, the metal precursor films comprise Group IB and Group-IIIA metals. In the case of CIGS absorbers, the metal precursor films comprise Cu, In, and Ga, with/without a Na source. This metal film needs to be converted to one or more chalcogenide compound(s) to form the absorber layer. The metal precursor film is converted to one or more chalcogenide compound(s) by heating the film in the presence of a source of one or more Group-VIA elements as indicated in step 606. Optionally, the chalcogenide film can be annealed as indicated in step 608. For CIGS-type absorbers, a variation of the 2-step process comprises depositing a second thin Group-IIIA-containing film or Group-IIIA chalcogenide material (e.g. Ga—Se, or Al—Se) on top of the metal precursor film as illustrated in step 604. The Group-IIIA metal is bound in the chalcogenide, its diffusion (e.g. Ga, or Al) toward the back of the absorber layer is retarded, yielding a higher concentration of the Group-IIIA metal at the front of the absorber layer. This results in a double-graded composition of the Group-IIIA metal and a double-graded bandgap.

Generally, the 2-step method may comprise more than two steps when various wet chemical and/or conversion methods (e.g. for densification or contaminant removal) and/or deposition steps (e.g. for a separate chalcogen layer as discussed previously) are used to form the metal precursor film. As discussed above, the metal precursor film may be a single layer or may be formed from multiple layers, it may be dense or porous.

The highest efficiencies for 2-step CIG(S)Se have been achieved by converting PVD (sputtered) Cu(In,Ga) into CIG(S)Se by a chalcogenization process where the Cu(In,Ga) film is both selenized and sulfurized, meaning the final absorber (CIGSSe) contains both selenium and sulfur. Unfortunately, CIG(S)Se formed using a 2-step process has not yet achieved >20% efficiency, and lags ~2% behind the laboratory champion of CIGSe. This is mainly due to the fact that it is challenging to control both bandgap grading and maintain a high minority carrier lifetime when sulfur is introduced.

Unfortunately, the traditional 2-step approach based on Cu(In,Ga) followed by selenization (without introducing sulfur) has so far only resulted in flat bandgap profiles, or single-graded CIGSe, resulting in efficiencies <16.0%.

It should be noted that the above cited efficiencies are laboratory champion efficiencies for ~0.5 $cm^2$ solar cells, not to be confused with commercially available, average, solar panel efficiencies which are typically 5-6% lower than laboratory champions, due to a combination of non-uniformity within solar cells, mismatch between series-connected cells, absorption losses in thick TCO layers, encapsulant, and glass, scribe and edge losses, and additional series resistance, all in addition to running a different process in the factory compared to the laboratory.

One of the main challenges for 2-step selenization is to control the phase separation in the Cu-poor film. High efficiency CIG(S)Se requires a Cu-poor (p-type) CIGSe film. Cu-poor Cu(In,Ga) metal films prior to chalcogenization are multi-phasic (2 or more separate phases present in the film), and as such, are hard to deposit in a homogeneous fashion that provides a conformal, smooth, uniform Cu(In,Ga) film, especially, due to the fact that indium-rich phases have the tendency to agglomerate due to poor wetting of underlying surfaces. Laterally uniform Cu(In,Ga) and Cu(In,Ga)$Se_2$ films are needed to avoid the formation of weak diodes that reduce the overall solar cell efficiency.

The agglomeration of indium is typically minimized by reducing the dynamic deposition rate, and/or controlling the substrate temperature during PVD, and/or introducing a multi-layer stack of alternating layers of In-rich and Cu-rich layers, all resulting in additional Capital Expenditure (CapEx). Other approaches try to avoid the phase separation by depositing a chalcogenide precursor film by PVD from binary, or multinary chalcogenide targets which results in a CapEx investment typically >3× higher than for PVD-CIG due to the deposition of a film ~3× thicker with a lower dynamic deposition rate. In addition, direct material costs for the chalcogenide targets are higher than for the metallic targets.

A second challenge for 2-step selenization is to control bandgap grading in depth in the final CIGSe film by Ga/(In+Ga) compositional grading. Ga-rich phases selenize slower than Cu and In, and therefore, most of the Ga collects at the back of the CIGSe film resulting in a single-graded CIGSe film. One way to avoid this Ga migration and maintain a flat Ga distribution is to extend the selenization time (>30 min), and go to high temperatures (550-600 C), not compatible with all low-temperature, low-cost substrates. Furthermore, this has not resulted in any double-graded CIGSe (>20%).

A third challenge for 2-step selenization is to prevent adhesion failure of the CIGSe film due to stress resulting from the expansion from Cu(In,Ga) to CIGSe at elevated temperature. The expansion from the metal film to the chalcogenide film can be 2.5-3.0× in volume. Additionally, the overall stack of layers may have very different coefficients of thermal expansion, thickness, and Young's modulus.

Figure 7:
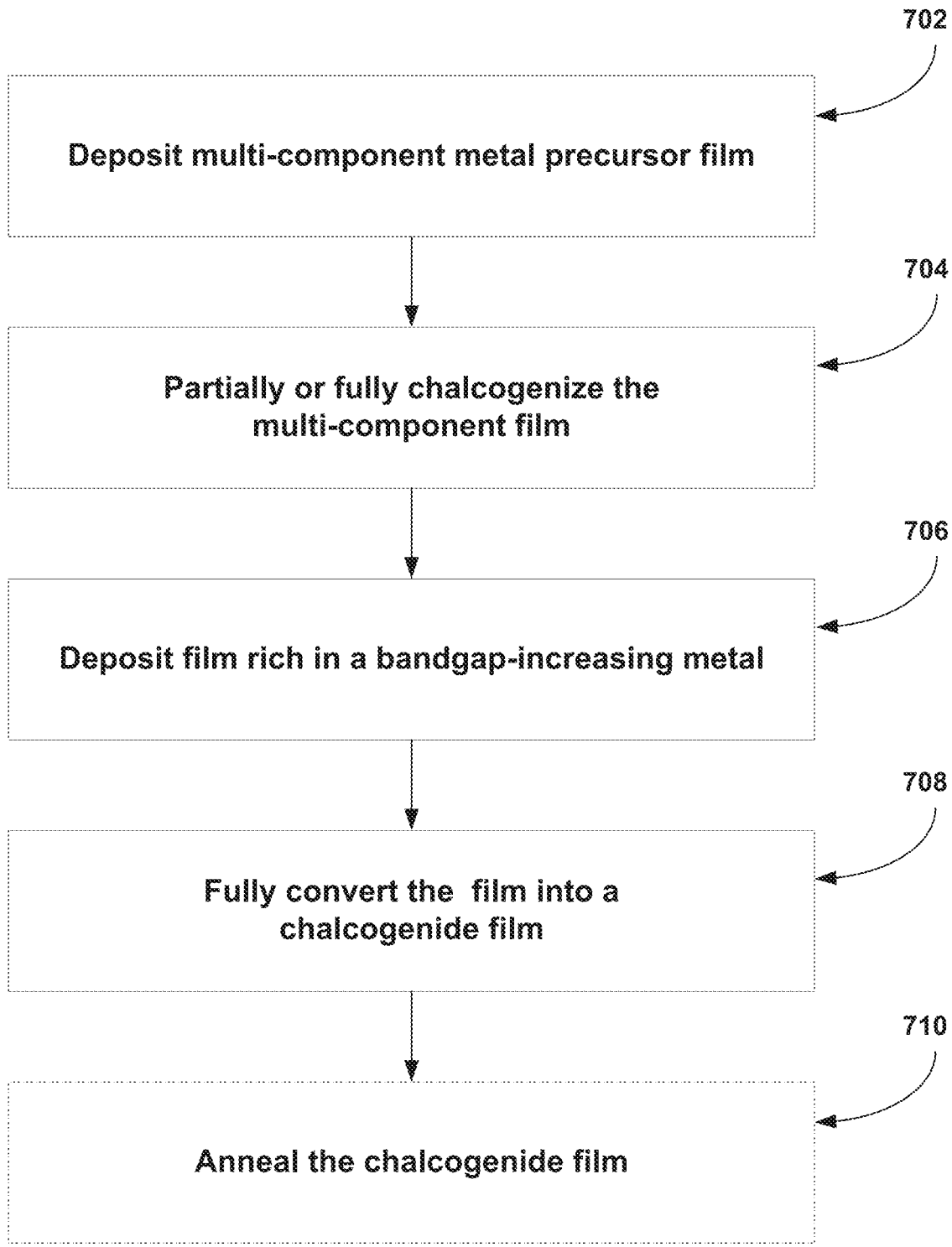
FIG. 7 is a flow chart for a generic 4-step process to form a CIGSe absorber layer.

A second way of grading CIGS materials is by a 4-step approach as illustrated in FIG. 7. In step 702, "metal precursor" films are deposited. For CIGS-like absorbers, the metal precursor films comprise Group IB and Group-IIIA metals. In the case of CIGS absorbers, the metals comprise Cu, In, and Ga, with/without a Na source. This metal precursor film needs to be converted to a chalcogenide to form the absorber layer. The metal precursor film is converted (partially or fully) to a chalcogenide by heating the film in the presence of a source of one or more Group-VIA elements as indicated in step 704. As used herein, it will be understood that "partially converted" will be understood to mean that at least a portion of the metal precursor film is converted to a chalcogenide through exposure to a chalcogen at elevated temperature. In step 706, a layer rich in a bandgap-increasing metal (relative to the metal precursor film deposited in step 702) is formed on the surface of the partially or fully chalcogenized precursor film. For example, if the metal precursor film deposited in step 702 is a Cu—In—Ga material, then at least one of Ga/(Ga+In) or Ag/(Ag+Cu) is greater in the layer deposited in step 706 than in the metal precursor film deposited in step 702. In step 706, the layer rich in a bandgap-increasing metal may be a metal, a metal alloy, or a metal chalcogenide material (e.g. metal oxide, metal sulfide, metal selenide, metal telluride, etc.). In step 708, the entire precursor stack to form the final absorber is converted using a chalcogenization process. The chalcogenization process may include an additional anneal step at the end to improve the device performance as illustrated in step 710. Details of a chalcogenization process including an additional anneal step are described in U.S. patent application Ser. No. 13/283,225, entitled "*Method of Fabricating CIGS by Selenization at High Temperatures*", filed on Oct. 27, 2011, which is herein incorporated by reference.

Generally, the 4-step method may comprise more than 4 steps when various wet chemical and/or conversion methods (e.g. for densification or contaminant removal) and/or deposition steps are used to form the metal precursor film and/or the metal rich layer. As discussed above, the metal precursor film and/or the metal rich layer may each be a single layer or may each be formed from multiple layers, it may be dense or porous.

In each of the multi-step methods described herein, the performance of the absorber layer can be improved by incorporating a small amount (i.e. about 0.1 atomic %) of Na prior, during, or after the growth of the absorber layer. The incorporation of Na results in improved film morphology, higher conductivity, and beneficial changes in the defect distribution within the absorber material. The Na may be introduced in a number of ways. The Na may diffuse out of the glass substrate, out of a layer disposed between the glass substrate and the back contact (e.g. a Na containing sol-gel layer formed under the back contact), or out of the back contact (e.g. molybdenum doped with a Na salt). The Na may be introduced from a separate Na containing layer formed on top of the back contact. The Na may be introduced by incorporating a Na source in the Cu(In, Ga) precursor film. Examples of suitable Na sources comprise $Na_2Se$, $Na_2O_2$, NaF, $Na_2S$, etc. The Na may be introduced from a separate Na containing layer formed on top of the Cu(In, Ga) precursor film. The Na may be introduced from a separate Na containing layer formed on top of the partially or completely chalcogenized CIGS film. The Na may be introduced by incorporating a Na source in the Ga-rich film. The Na may be introduced from a separate Na containing layer formed on top of the Ga-rich film. The Na may be introduced by incorporating a Na source during the selenization step. The Na may be introduced after the final selenization step, followed by a heat treatment. The Na may be introduced by combining any of these methods as required to improve the performance of the absorber layer. It should be noted that similar Group IA, and/or Group IIA elements like K, and Ca might be used instead of sodium.

In each of the multi-step methods described above and the examples to be disclosed below, a metal precursor film(s) is deposited. Typically, the precursor material will deviate in shape, size, composition, homogeneity, crystallinity, or some combination of these parameters from the absorber material that is ultimately formed as a result of the method. As mentioned previously, the metal precursor film(s) can comprise multiple layers. These layers may be deposited by the same or by different deposition techniques. These layers can be porous, or dense.

The metal precursor film(s) can be deposited using a number of techniques. Examples comprise dry deposition techniques such as batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, etc.

The efficiency of a TFPV device depends on the bandgap of the absorber material. The goal is to have the bandgap tuned to the energy range of the photons incident on the device. The theoretical upper limit for a single p-n junction solar cell has been calculated to be about 33 to 34%. The peak in the efficiency occurs for values of the bandgap between about 1.0 eV and about 1.5 eV, and more specifically between about 1.3 eV and about 1.5 eV. The bandgap for CIGSe films varies smoothly from CISe=1.00 (i.e. Ga/(Ga+In)=0.0) to CGSe=1.68 (i.e. Ga/(Ga+In)=1.0). The region of interest is from Ga/(Ga+In)=0.4 (~1.23 eV) to Ga/(Ga+In)=0.7 (~1.45 eV).

Typically, CIGSe TFPV absorber materials have included Ga concentrations (Ga/(Ga+In)) between about 0.15 and about 0.30. This range is largely dictated by the inability to fabricate Cu—Ga PVD (sputtering) targets with high Ga concentrations. Using traditional casting techniques, it has been difficult to form Cu—Ga targets with high Ga content without phase separation, Ga agglomeration, and/or mechanical issues with the targets (e.g. cracking, spalling, etc.).

In some embodiments, Cu—Ga targets are used wherein the Cu—Ga target is formed using hot (isostatic pressure) techniques to form the targets from (atomized) powders. This technique allows a broad range of Ga concentrations to be realized. Additionally, other elements may be included within the target such as Ag and In, and optionally, a source of Na, or similar element like K, Mg, or Ca. The targets will be largely metallic and the sputtering yields of these components are similar in the typical processing ranges used to deposit Cu—In—Ga precursor films. Therefore, it is not a requirement that the targets be manufactured as single phase or with a composition that corresponds to an equilibrium compound. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$). In some embodiments, the target includes a Cu—$In_yGa_x$ material (x+y) is between about 25 atomic % and about 66 atomic %. In some embodiments, the target includes a $Cu_wAg_z$—$In_yGa_x$ material wherein (x+y) is between about 25 atomic % and about 66 atomic %. FIG. 8 lists a number of potential target compositions. Those skilled in the art will understand that the potential target compositions listed in FIG. 8 are exemplary and that other potential target compositions are possible. Therefore, the present invention is not limited to the specific examples listed in FIG. 8.

In high volume manufacturing, the Cu—In—Ga precursor film is typically deposited using a PVD (sputtering) process. The deposition system may be a batch system or an in-line system, but the in-line system is preferred due to higher throughput and lower cost of ownership. The in-line system may be continuous (i.e. the substrates move continuously through the system) or the in-line system may use a "stop and soak" process wherein the substrates are transported to a process station where they stop until the process is completed. In-line systems typically include a number of process stations to allow different compositions to be deposited or to break a long deposition cycle into smaller, balanced, deposition cycles to increase the overall equipment efficiency of the system. At each process station, the substrate may be subjected to small translational oscillations to improve the uniformity of the deposition. This oscillation is not considered part of the transport of the substrate.

Figure 9:
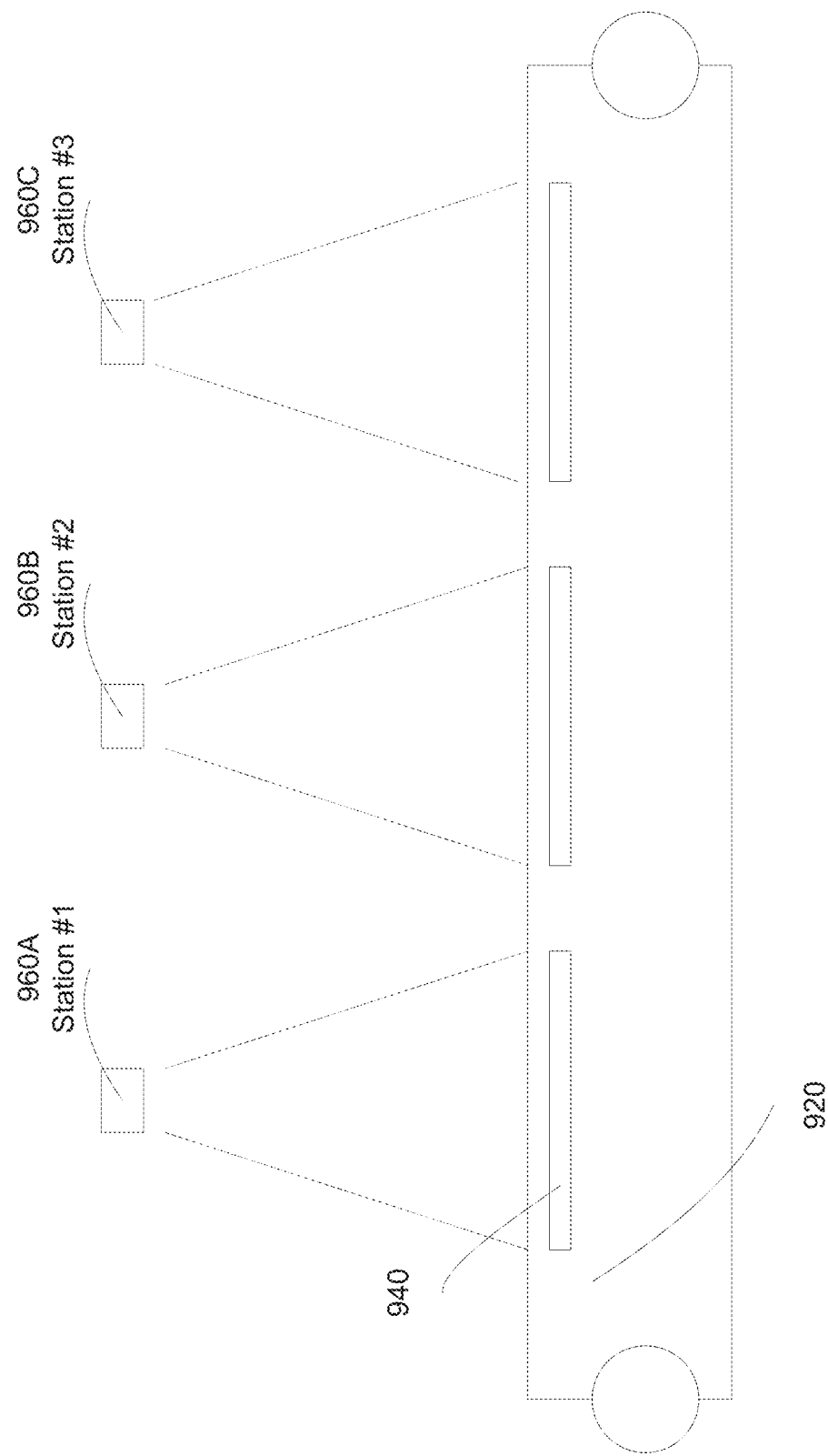
FIG. 9 is a schematic of an in-line deposition system according to some embodiments.

FIG. 9 illustrates an exemplary in-line deposition (e.g. sputtering) system according to some embodiments of the present invention. FIG. 9 illustrates a system with three deposition stations, but those skilled in the art will understand that any number of deposition stations can be supplied in the system. For example, the three deposition stations illustrated in FIG. 9 can be repeated and provide systems with 6, 9, 12, etc. targets, limited only by the desired layer deposition sequence and the throughput of the system. A transport mechanism 920, such as a conveyor belt or a plurality of rollers, can transfer substrate 940 between different deposition stations. For example, the substrate can be positioned at station #1, comprising a target assembly 960A, then transferred to station #2, comprising target assembly 960B, and then transferred to station #3, comprising target assembly 960C. Station #1 can be configured to deposit a Cu—In—Ga precursor film. Station #2 can be configured to deposit an additional Cu—In—Ga precursor film with the same or different composition. Station #3 can be configured to deposit an additional Cu—In—Ga precursor film with the same or different composition.

FIG. 10 illustrates examples of deposition configurations that may be used to produce Cu—In—Ga precursor films. FIG. 10 illustrates six examples of deposition configurations, those skilled in the art will understand that other configurations are possible and would fall within the scope of the present invention. In the configuration with ID=1, the first deposition is used to form a layer that is primarily composed of In. This layer may also include other elements at lower concentrations. This layer may be formed using any one of PVD (sputtering), evaporation, plating, or other deposition methods discussed previously. The second deposition is used to form a layer that is primarily composed of Cu. This layer may also include other elements at lower concentrations. This layer may be formed using any one of PVD (sputtering), evaporation, plating, or other deposition methods discussed previously. The third deposition is used to form a layer that is primarily composed of Cu—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. Those skilled in the art will understand that the absorber material formed after the conversion to a chalcogenide and after the interdiffusion will advantageously be Cu poor.

In the configuration with ID=2, the first deposition is used to form a layer that is primarily composed of Cu. This layer may also include other elements at lower concentrations. This layer may be formed using any one of PVD (sputtering), evaporation, plating, or other deposition methods discussed previously. The second deposition is used to form a layer that is primarily composed of In. This layer may also include other elements at lower concentrations. This layer may be formed using any one of PVD (sputtering), evaporation, plating, or other deposition methods discussed previously. The third deposition is used to form a layer that is primarily composed of Cu—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. Those skilled in the art will understand that the absorber material formed after the conversion to a chalcogenide and after the interdiffusion will advantageously be Cu poor.

In the configuration with ID=3, the first deposition is used to form a layer that is primarily composed of Cu—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. The second deposition is used to form a layer that is primarily composed of In. This layer may also include other elements at lower concentrations. This layer may be formed using any one of PVD (sputtering), evaporation, plating, or other deposition methods discussed previously. The third deposition is used to form a layer that is primarily composed of Cu. This layer may also include other elements at lower concentrations. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

In the configuration with ID=4, the first deposition is used to form a layer that is primarily composed of Cu—In. This layer may also include other elements at lower concentrations. This layer may be formed using PVD (sputtering), using a high In content target as discussed previously. The sputtering target used for the first deposition may range from Cu-poor composition (e.g. $Cu_1In_2$) to a Cu-rich composition (e.g. $Cu_{75}In_{25}$). The second deposition is used to form a layer that is primarily composed of Cu—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. The sputtering target used for the first deposition may range from Cu-poor composition (e.g. $Cu_1Ga_2$) to a Cu-rich composition (e.g. $Cu_{75}Ga_{25}$). The third deposition is optional and may be used to adjust the Cu—In—Ga content of the metal precursor film. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

In the configuration with ID=5, the first deposition is used to form a layer that is primarily composed of Cu—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. The sputtering target used for the first deposition may range from Cu-poor composition (e.g. $Cu_1Ga_2$) to a Cu-rich composition (e.g. $Cu_{75}Ga_{25}$). The second deposition is used to form a layer that is primarily composed of Cu—In. This layer may also include other elements at lower concentrations. This layer may be formed using PVD (sputtering), using a high In content target as discussed previously. The sputtering target used for the first deposition may range from Cu-poor composition (e.g. $Cu_1In_2$) to a Cu-rich composition (e.g. $Cu_{75}In_{25}$). The third deposition is optional and may be used to adjust the Cu—In—Ga content of the metal precursor film. The third deposition is optional and may be used to adjust the Cu—In—Ga content of the metal precursor film. This layer may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

In the configuration with ID=6, the first deposition is used to form a layer that is primarily composed of Cu—In—Ga. This layer may also include other elements at lower concentrations. This layer may be formed using PVD (sputtering) using a high Ga content target that has a Ga composition (Ga/(Ga+In)) in the range of about 0.25 to about 0.66 as discussed previously. The second and third depositions are optional and may be used to adjust the Cu—In—Ga content of the metal precursor film. These layers may be formed using any one of PVD (sputtering), evaporation, plating, or other deposition methods discussed previously. Those skilled in the art will understand that the absorber material formed after the conversion to a chalcogenide and after the interdiffusion will advantageously be Cu poor.

Those skilled in the art will understand that in each of the examples listed in FIG. 10, a portion of the Cu in any of the Cu-containing layers may be substituted with Ag.

In some embodiments, a system similar to that illustrated in FIG. 9 may have two deposition stations, typically to deposit a first metal precursor film and a second layer rich in a bandgap-increasing metal. Similar to alternate configurations discussed previously, the two stations can be duplicated within a system to yield systems with multiple stations and a high throughput.

In some embodiments, Na (or other Group-IA or Group-IIA elements) can be incorporated into the final absorber material. The Na (or other materials) can be incorporated into one or more of the metal targets or can be deposited as a separate layer. The Na (or other materials) can be deposited at the beginning of the deposition of the precursor layer(s), as an intermediate layer, or at the end of the deposition of the precursor layer(s).

In some embodiments, a capping layer (e.g. Se) can be deposited to protect the precursor layer(s) from the ambient environment prior to the chalcogenization step.

It is desirable to optimize the selenization of the metal precursor films by increasing the reaction temperature. At elevated temperatures, In agglomeration competes against selenization. Under conditions where In agglomeration occurs despite selenization, In particulates segregate from the metal precursor film and form separate binary phases. The resulting films have a spotty and blister-like visual appearance. X-ray diffraction (XRD) spectra on these films show InSe (004) and (006) peaks in addition to the ternary chalcopyrite phases. There is no photo-luminescence (PL) intensity on these films and device results are poor. To solve this problem, an intermediate, lower temperature selenization step at between about 300 C and about 450 C is introduced to partially selenize the precursor film before complete selenization at higher temperatures. The additional step secures the indium in a selenized state to prevent agglomeration. This eliminates the problem of binary phase formation in the final selenization step.

Another problem typically encountered during selenization is the difficulty to control the degree of selenization at higher temperatures. The selenization reaction of CIGSe occurs at temperatures above about 350 if the Se source is $H_2Se$. In an exemplary batch furnace, the ramp rates are generally limited to about 10 C/min by hardware. Those skilled in the art will understand that parameters such as ramp rates and temperature uniformity within processing equipment depend on the details of the equipment and that exemplary values used herein are not limiting. If the furnace temperature is increased to 600 C, delamination at the Mo/CIGSe interface is observed due to over-selenization and formation of a thick $MoSe_2$ layer. In some embodiments of the present invention, a fast gas exchange step is introduced at the high temperature step to replace $H_2Se$ in the furnace with an inert gas such as Ar, $N_2$, etc. to stop further selenization. This resolves the delamination problem due to over-selenization by limiting the formation of the $MoSe_2$ layer. Details of the fast gas exchange process are described in U.S. patent application Ser. No. 13/283,225 entitled "*Method of Fabricating CIGS by Selenization at High Temperature*" filed on Oct. 27, 2011 and is herein incorporated by reference.

Figure 11:
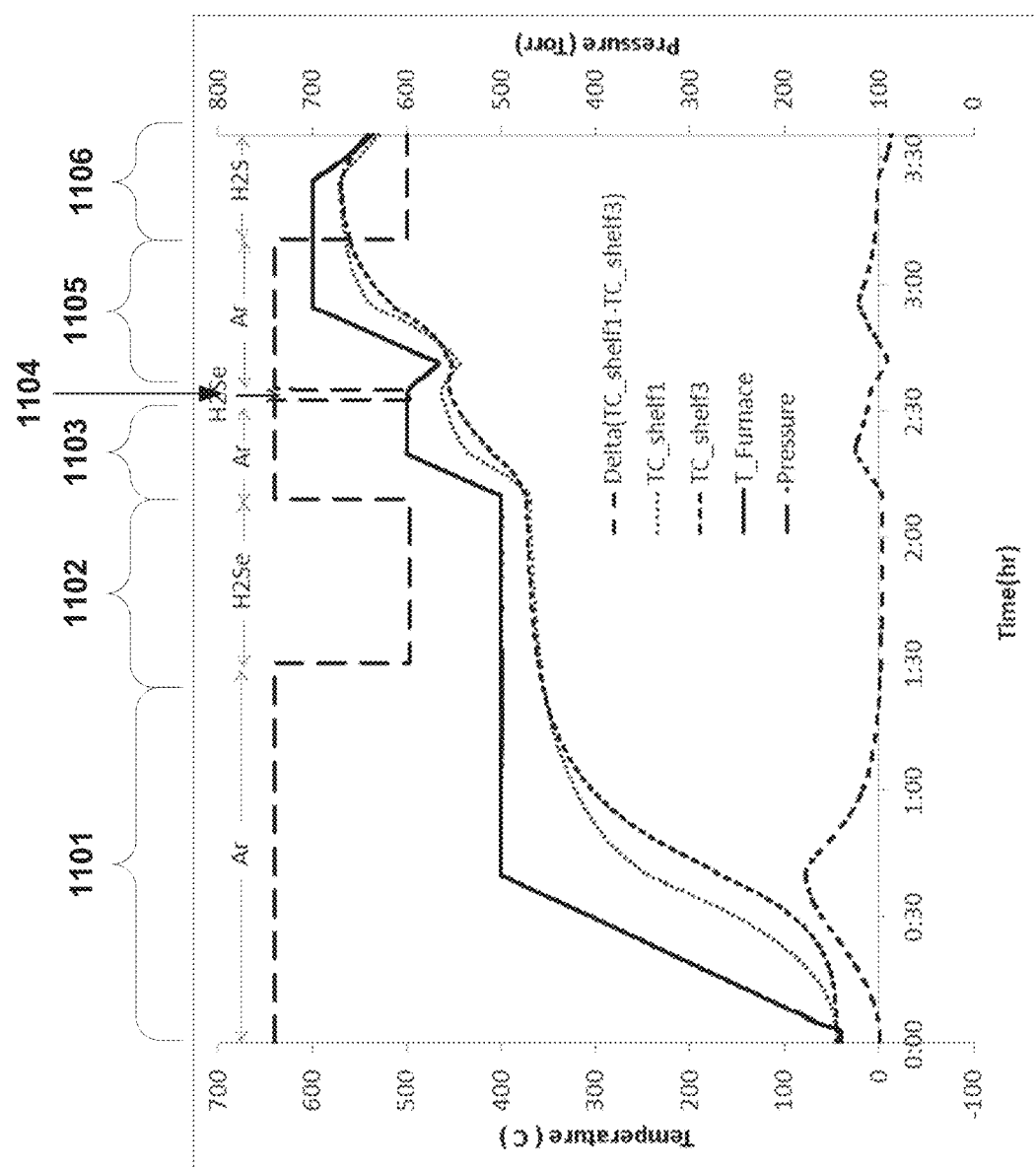
FIG. 11 illustrates a diagram depicting the temperature, temperature uniformity, gas flows, and chamber pressure during a selenization process according to some embodiments of the present invention.

FIG. 11 illustrates a diagram depicting the temperature, temperature uniformity, gas flows, and chamber pressure during an exemplary selenization/sulfurization process. Details of the selenization process are described in U.S. patent application Ser. No. 13/461,495 entitled "*Method of Uniform Selenization and Sulfurization in a Tube Furnace*" filed on May 1, 2012 and is herein incorporated by reference for all purposes. Those skilled in the art will understand that parameters such as flow rates, gas composition, ramp rates, and temperature uniformity within processing equipment depend on the details of the equipment and that exemplary values used in the discussion to follow are not limiting. The Cu—In—Ga precursor film may be a blanket film covering the entire substrate or may comprise a plurality of site isolated regions wherein the composition of the Cu—In—Ga precursor film has been varied in a combinatorial manner as discussed previously. The uniformity of the selenization/sulfurization process is largely determined by the temperature uniformity within the furnace. The temperature non-uniformity between the shelves in the furnace is illustrated by the curve labeled "Delta(TC_shelf1-TC_shelf3)". It is noted that the non-uniformity is large during temperature ramp steps from one temperature to the next temperature. If the precursor film is exposed to a source of Se during these periods, the selenization of the film would be non-uniform and the device performance would be poor. This non-uniformity may be addressed by limiting the exposure to a source of Se during periods of high temperature non-uniformity and by adjusting the ramp rate of the furnace to maintain a temperature non-uniformity across the substrate of less than about 10 C. However, in the absence of a source of Se, indium will diffuse and agglomerate. In some embodiments, the precursor film is exposed to an inert gas flow (i.e. Ar) during the temperature ramp steps, denoted by time period 1101 in FIG. 11. To decrease the indium agglomeration, the pressure within the furnace is increased to between about 1 atmosphere and about 2 atmospheres during temperature ramp steps. A pressure of 1 atmosphere has been illustrated in FIG. 11. The target temperature range for time period 1101 is between about 350 C and about 450 C, and preferably between about 400 C and about 450 C. The temperature setpoint in FIG. 11 for time period 1101 has been illustrated as 400 C.

Once the temperature has stabilized, the pressure in the furnace is reduced to between about 600 Torr and 700 Torr and the precursor film is exposed to a source of Se (e.g. $H_2Se$, diethylselenide (DESe), Se vapor, etc.). In this case, the source of Se is $H_2Se$, denoted by time period 1102 in FIG. 11. An exemplary concentration of the $H_2Se$ is about 1 molar % $H_2Se$ in Ar. The temperature uniformity within the furnace is acceptable during this step and the selenization/sulfurization process will also be uniform.

As illustrated in FIG. 11, the furnace is then ramped to an intermediate temperature of between about 450 C and about 550 C, denoted by time period 1103 in FIG. 11. The temperature setpoint in FIG. 11 for time period 1103 has been illustrated as 500 C. As before, during this time, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 11.

In some embodiments, it is advantageous to expose the CIGS film to a second selenization/sulfurization process, denoted by time period 1104 in FIG. 11. This step completes the selenization/sulfurization of the film. As before, the pressure in the furnace is reduced to between about 600 Torr and 700 Torr and the precursor film is exposed to a source of Se (e.g. $H_2Se$, diethylselenide (DESe), Se vapor, etc.). In this case, the source of Se is $H_2Se$. The higher temperature results in increased crystallinity, larger grains, and improved optoelectronic performance. To prevent the over-selenization of the film, a fast gas exchange step is introduced near the beginning of the high temperature step. In this process, the $H_2Se$ flow is stopped and the $H_2Se$ gas within the chamber is quickly removed through a combination of an increased inert gas purge and pumping capacity.

As illustrated in FIG. 11, the furnace is then ramped to a final temperature of between about 550 C and about 650 C to anneal the film, denoted by time period 1105 in FIG. 11. As before, during this time, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 11. The purpose of this anneal step is mainly to allow the indium and gallium to interdiffuse within the film.

In some embodiments, it is advantageous to expose the CIGS film to an optional sulfurization process, denoted by time period 1106 in FIG. 11. This step completes the sulfurization of the film. As before, the pressure in the furnace is reduced to about 600 Torr and the precursor film is exposed to a source of S. In this case, the source of S is $H_2S$.

In some embodiments of the present invention, the methods are implemented on a rapid thermal processing (RTP) system configuration. In an RTP system, the temperature of the substrates is increased and controlled through the use of lamp heaters while the substrates reside in a process chamber. The chambers may operate at pressures above atmospheric pressure or may operate at pressures below atmospheric pressure.

In some embodiments of the present invention, substrates are loaded into a RTP chamber that raises the temperature of the substrate from about room temperature to between about 350 C and about 450 C, and preferably to between about 400 C and about 450 C, in the presence of Ar at a pressure between about 1 atmosphere and about 2 atmospheres. After reaching the desired temperature, the substrates are held at that temperature until the substrates reach thermal equilibrium. The slow ramp and soak at low temperature ensures that the substrate and the deposited Cu—In—Ga metal precursor film do not suffer from thermal shock and that the temperature is uniform. In the next step, the precursor film is exposed to about 1 molar % $H_2Se$ in Ar at a pressure of less than 1 atmosphere and the Cu—In—Ga metal precursor film is partially selenized for a period of time. This step secures the indium in a selenized state and helps to prevent agglomeration. In the next step, the temperature is raised to between about 500 C and about 550 C and the Cu—In—Ga metal precursor film selenized for a period of time. The higher temperature is possible due to the earlier reaction of the In with the $H_2Se$ during the initial low temperature partial selenization step. The higher temperature results in increased crystallinity, larger grains, and improved optoelectronic performance. To prevent the over-selenization of the film, a fast gas exchange step is introduced near the beginning of the high temperature step. In this process, the $H_2Se$ flow is stopped and the $H_2Se$ gas within the chamber is quickly removed through a combination of an increased inert gas purge and pumping capacity. The CIGS film can be annealed at between about 550 C and about 650 C to influence the Ga distribution throughout the depth of the film.

In some embodiments, it is advantageous to expose the CIGS film to an optional sulfurization process. This step completes the sulfurization of the film. As before, the pressure in the RTP is reduced and the precursor film is exposed to a source of S. In this case, the source of S can be $H_2S$.

Figure 12:
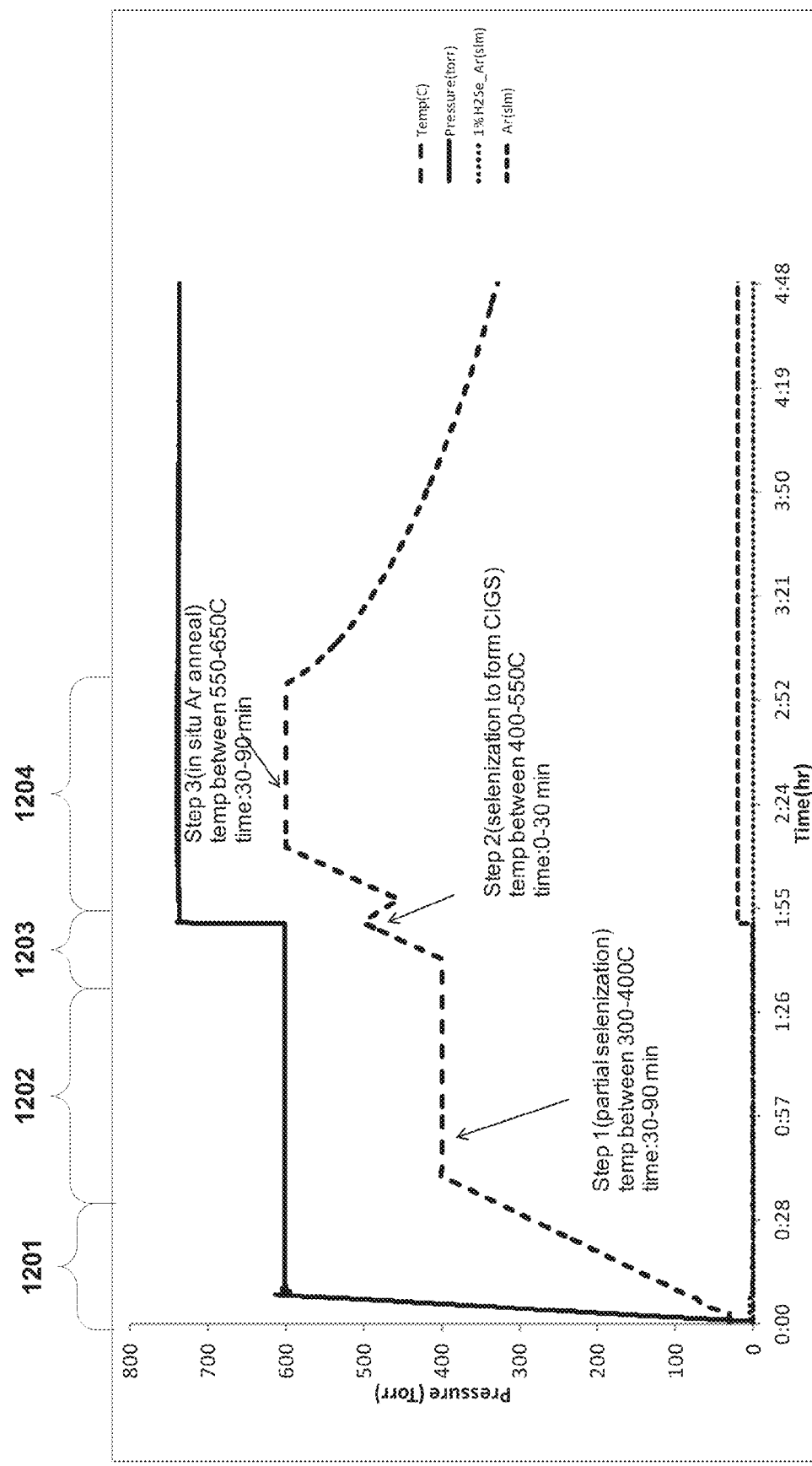
FIG. 12 illustrates a diagram depicting the temperature, gas flows, and chamber pressure during a selenization process according to some embodiments of the present invention.

An alternate furnace profile is illustrated in FIG. 12. As discussed previously, a fast gas exchange step is introduced to replace $H_2Se$ in the furnace with an inert gas such as Ar, $N_2$, etc. to control the selenization. A detailed discussion of this furnace profile is described in co-owned U.S. patent application Ser. No. 13/563,448 entitled *"Method of Chalcogenization to Form high Quality CIGS for Solar Cell Applications"* which is herein incorporated by reference for all purposes.

FIG. 12 illustrates a diagram depicting the temperature, gas flows, and chamber pressure during a selenization process according to some embodiments of the present invention. The Cu—In—Ga metal precursor film may be a blanket film covering the entire substrate or may comprise a plurality of site isolated regions wherein the composition of the Cu—In—Ga metal precursor film has been varied in a combinatorial manner as discussed previously. The uniformity of the selenization process is largely determined by the temperature uniformity within the furnace. If the precursor film is exposed to a source of Se during these periods, the selenization of the film would be non-uniform and the device performance would be poor. This non-uniformity may be addressed by eliminating the exposure to a source of Se during these periods. However, in the absence of an exposure to a source of Se, indium will diffuse and agglomerate at temperatures above about 350 C. In some embodiments, the precursor film is exposed to an inert gas flow (i.e. Ar) with a small amount of $H_2Se$ during the initial temperature ramp steps, denoted by time period 1201 in FIG. 12. As an example, the flow of a molar 1% $H_2Se$ in Ar gas may be held at about 1 standard liter per minute (slpm) during the initial temperature ramp. This provides enough Se to prevent the agglomeration of In, but does not provide enough Se to promote non-uniform selenization due to the temperature non-uniformity. A pressure of less than 1 atmosphere has been illustrated in FIG. 12. This pressure is selected as a safety precaution due to the toxic nature of $H_2Se$. The target temperature range for time period 1201 is between about 300 C and about 400 C. As discussed previously, those skilled in the art will understand that parameters such as flow rates, gas composition, ramp rates, and temperature uniformity within processing equipment depend on the details of the equipment and that exemplary values used in the discussion to follow are not limiting.

Once the temperature has stabilized, the metal precursor film is held at this temperature and exposed to a dilute source of Se (e.g. $H_2Se$, diethylselenide (DESe), Se vapor, etc.). In this case, the source of Se is $H_2Se$, denoted by time period 1202 in FIG. 12. An exemplary concentration of the $H_2Se$ is about 1 molar % $H_2Se$ in Ar. The concentration of Se is low so that the selenization process is slow and uniform. The temperature uniformity within the furnace is acceptable during this step and the partial selenization process will also be uniform.

As illustrated in FIG. 12, the furnace is then ramped to an intermediate temperature of between about 400 C and about 550 C, denoted by time period 1203 in FIG. 12. As before, during this time, the CIGS film is exposed to a dilute source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 12. This step completes the selenization of the metal precursor film. The increased temperature serves to increase the kinetics of the selenization reaction and the metal precursor film is fully converted.

As illustrated in FIG. 12, the furnace is then ramped to a final temperature of between about 550 C and about 650 C to anneal the film, denoted by time period 1205 in FIG. 12. During this time period, the CIGS film is not exposed to a source of Se. The furnace is filled with an inert gas (i.e. Ar) and the pressure within the furnace is increased to between about 1 atmosphere and about 2 atmospheres during temperature ramp steps. A pressure of 1 atmosphere has been illustrated in FIG. 12. The purpose of this anneal step is mainly to allow the indium and gallium to interdiffuse within the film.

Figure 13:
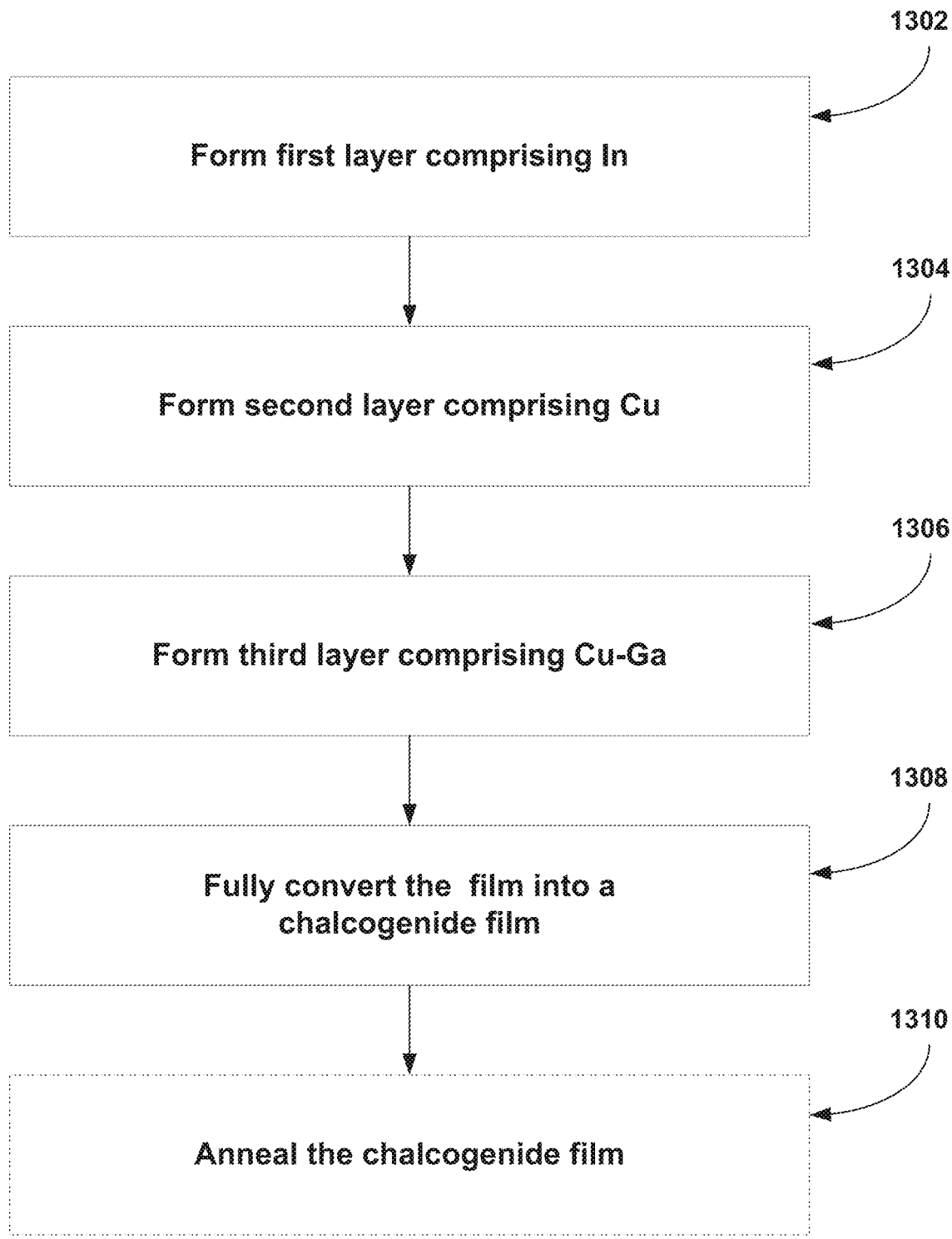
FIG. 13 is a flow chart for a method used to form an absorber material according to some embodiments.

FIG. 13 illustrates a flow chart, 1300, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1302, a first layer is formed above a surface of the substrate. In some embodiments, the first layer comprises In. The first layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1304, a second layer is formed above the first layer. In some embodiments, the second layer comprises Cu. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1306, a third layer is formed above the second layer. In some embodiments, the third layer comprises Cu—Ga. The third layer may be formed by a batch or in-line PVD (sputtering) technique. Advantageously, the third layer is formed from one of the Cu—Ga target compositions discussed earlier in reference to FIG. 8. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$). At this point, the three layers have formed a metal precursor film as there will likely be some interdiffusion during the various forming steps. As discussed previously, the metal precursor film is advantageously Cu-poor so that the absorber material will exhibit p-type behavior.

In step 1308, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1310 illustrates an option anneal to allow the interdiffusion of In and Ga within the film as discussed previously. This step may be integrated in the chalcogenization process (e.g. step 1308 as discussed previously) or may be a separate step.

In some embodiments, a fourth layer that includes Ag is formed above the third layer before the chalcogenization step (e.g. between steps 1306 and 1308—not shown). The addition of Ag provides an additional mechanism for altering the bandgap grading and improving the performance of the device.

In some embodiments, the metal precursor film further includes Na. The Na may be added during any of the layer formation steps (i.e. steps 1302-1306—not shown) or may be added as a separate layer before the chalcogenization step as discussed previously.

Advantageously, the method illustrated in FIG. 13 excludes the purposeful addition or exposure of the metal precursor film to a source of S. As discussed previously, the addition of S complicates the chalcogenization of the metal precursor film and the formation of the chalcogenide material.

Figure 14:
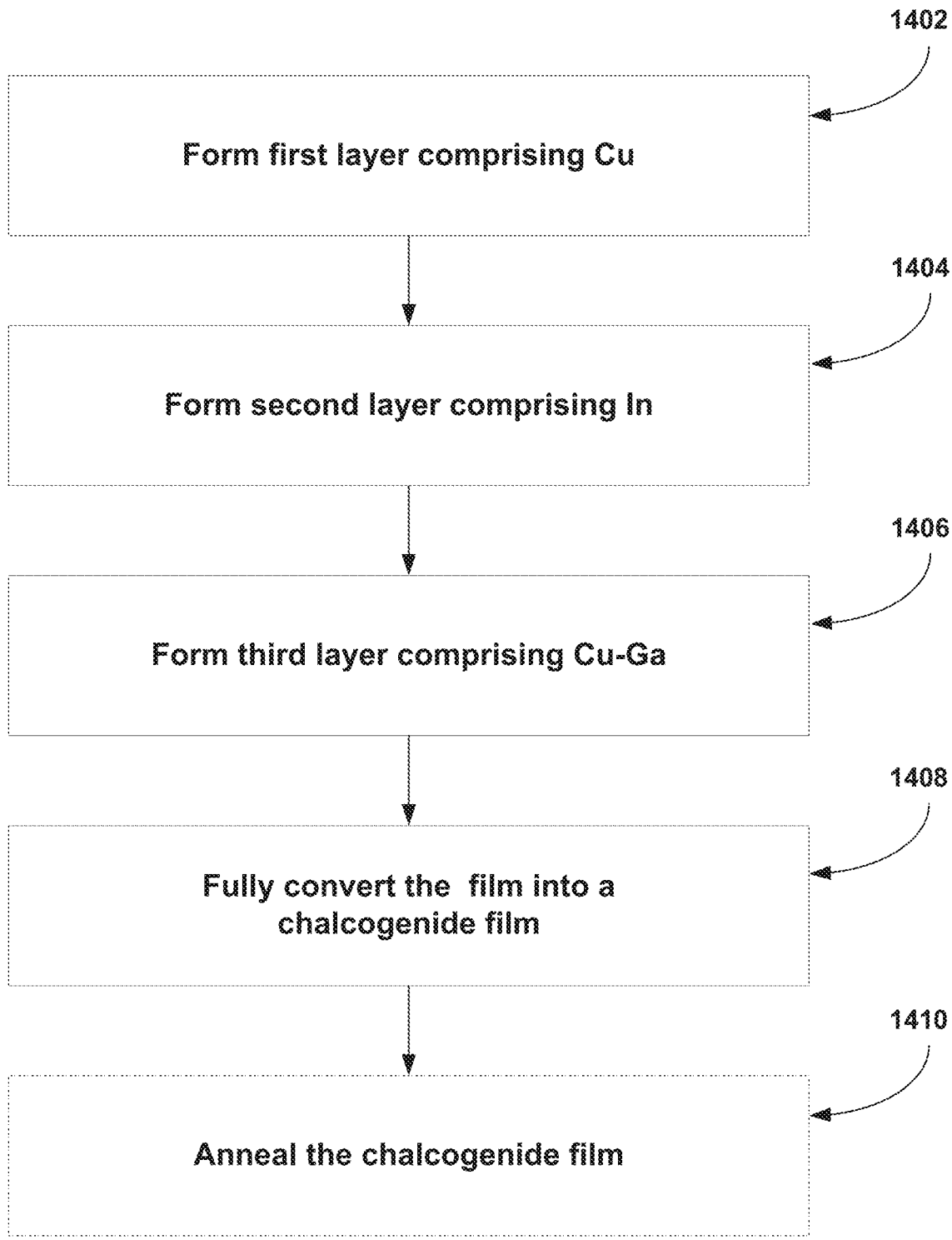
FIG. 14 is a flow chart for a method used to form an absorber material according to some embodiments.

FIG. 14 illustrates a flow chart, 1400, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1402, a first layer is formed above a surface of the substrate. In some embodiments, the first layer comprises Cu. The first layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1404, a second layer is formed above the first layer. In some embodiments, the second layer comprises In. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1406, a third layer is formed above the second layer. In some embodiments, the third layer comprises Cu—Ga. The third layer may be formed by a batch or in-line PVD (sputtering) technique. Advantageously, the third layer is formed from one of the Cu—Ga target compositions discussed earlier in reference to FIG. 8. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$). At this point, the three layers have formed a metal precursor film as there will likely be some interdiffusion during the various forming steps. As discussed previously, the metal precursor film is advantageously Cu-poor so that the absorber material will exhibit p-type behavior.

In step 1408, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1410 illustrates an option anneal to allow the interdiffusion of In and Ga within the film as discussed previously. This step may be integrated in the chalcogenization process (e.g. step 1408 as discussed previously) or may be a separate step.

In some embodiments, a fourth layer that includes Ag is formed above the third layer before the chalcogenization step (e.g. between steps 1406 and 1408—not shown). The addition of Ag provides an additional mechanism for altering the bandgap grading and improving the performance of the device.

In some embodiments, the metal precursor film further includes Na. The Na may be added during any of the layer formation steps (i.e. steps 1402-1406—not shown) or may be added as a separate layer before the chalcogenization step as discussed previously.

Advantageously, the method illustrated in FIG. 14 excludes the purposeful addition or exposure of the metal precursor film to a source of S. As discussed previously, the addition of S complicates the chalcogenization of the metal precursor film and the formation of the chalcogenide material.

Figure 15:
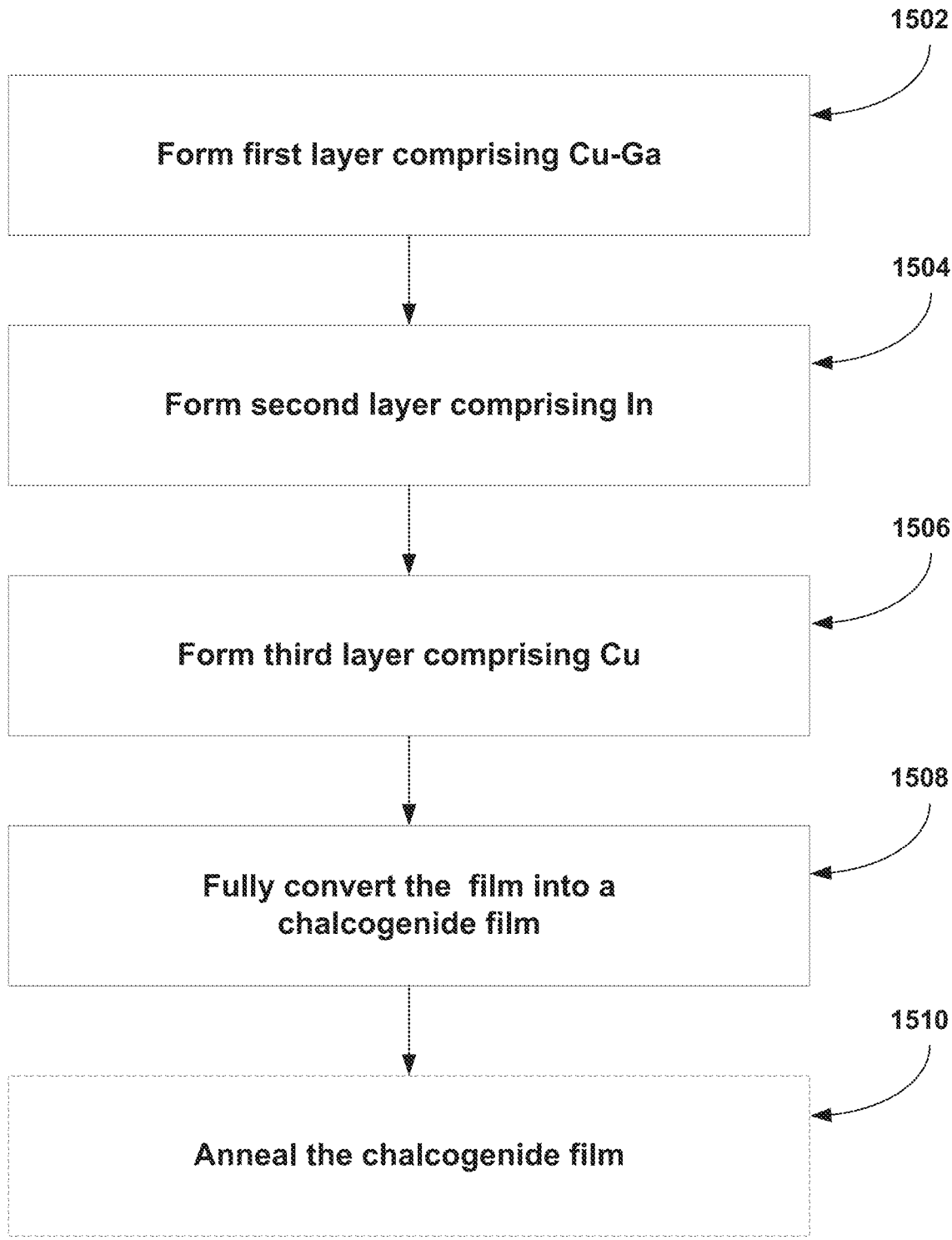
FIG. 15 is a flow chart for a method used to form an absorber material according to some embodiments.

FIG. 15 illustrates a flow chart, 1500, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1502, a first layer is formed above a surface of the substrate. In some embodiments, the first layer comprises Cu—Ga. The first layer may be formed by a batch or in-line PVD (sputtering) technique. Advantageously, the first layer is formed from one of the Cu—Ga target compositions discussed earlier in reference to FIG. 8. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$).

In step 1504, a second layer is formed above the first layer. In some embodiments, the second layer comprises In. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

In step 1506, a third layer is formed above second first layer. In some embodiments, the third layer comprises Cu. The third layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions. At this point, the three layers have formed a metal precursor film as there will likely be some interdiffusion during the various forming steps. As discussed previously, the metal precursor film is advantageously Cu-poor so that the absorber material will exhibit p-type behavior.

In step 1508, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1510 illustrates an option anneal to allow the interdiffusion of In and Ga within the film as discussed previously. This step may be integrated in the chalcogenization process (e.g. step 1508 as discussed previously) or may be a separate step.

In some embodiments, a fourth layer that includes Ag is formed above the third layer before the chalcogenization step (e.g. between steps 1506 and 1508—not shown). The addition of Ag provides an additional mechanism for altering the bandgap grading and improving the performance of the device.

In some embodiments, the metal precursor film further includes Na. The Na may be added during any of the layer formation steps (i.e. steps 1502-1506—not shown) or may be added as a separate layer before the chalcogenization step as discussed previously.

Advantageously, the method illustrated in FIG. 15 excludes the purposeful addition or exposure of the metal precursor film to a source of S. As discussed previously, the addition of S complicates the chalcogenization of the metal precursor film and the formation of the chalcogenide material.

Figure 16:
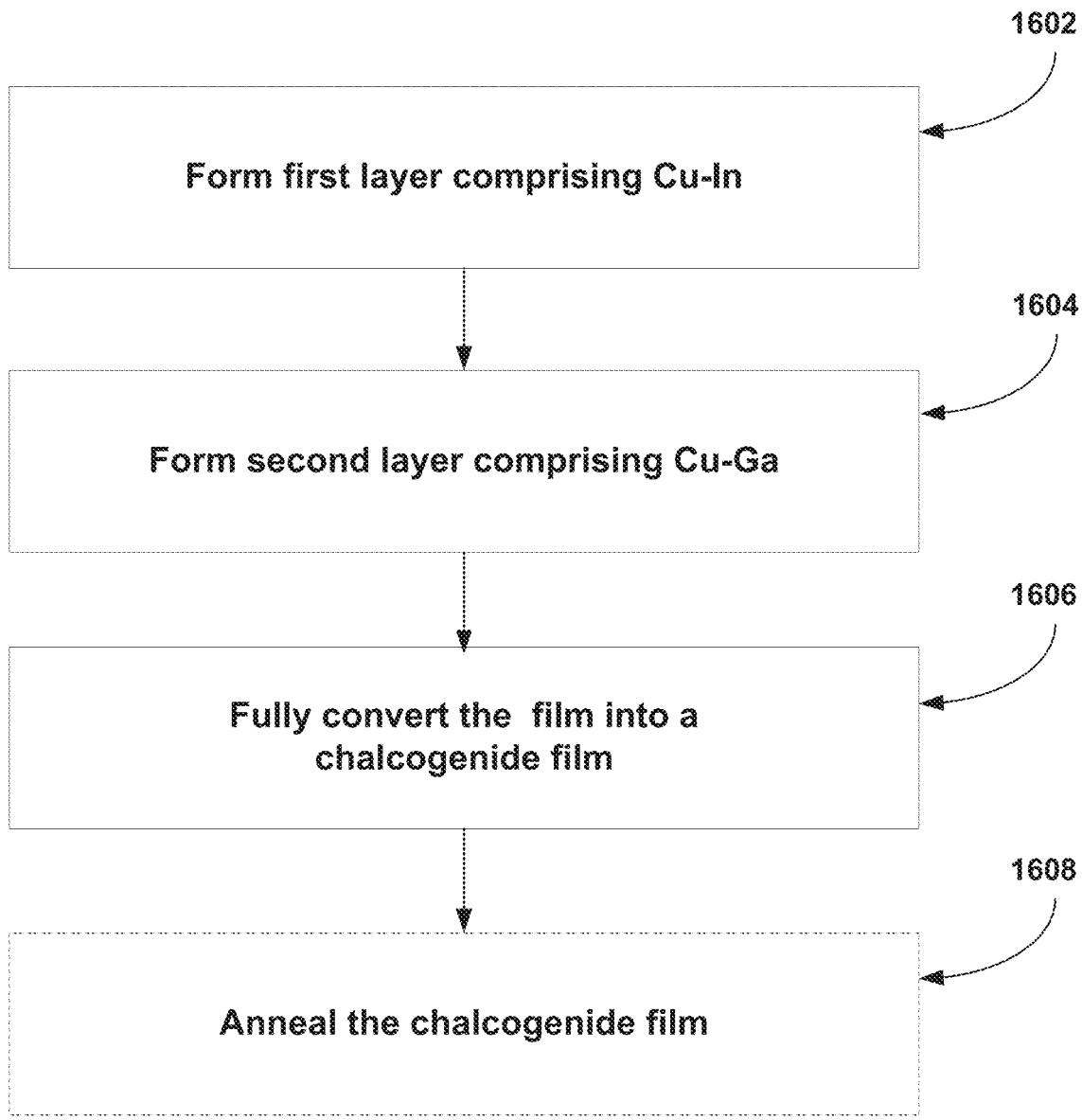
FIG. 16 is a flow chart for a method used to form an absorber material according to some embodiments.

FIG. 16 illustrates a flow chart, 1600, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1602, a first layer is formed above a surface of the substrate. In some embodiments, the first layer comprises Cu—In. The first layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions. In some embodiments, the first layer is formed using batch or in-line PVD (sputtering) technique wherein the sputtering target comprises an In content of greater than 50%.

In step 1604, a second layer is formed above the first layer. In some embodiments, the second layer comprises Cu—Ga. The second layer may be formed by a batch or in-line PVD (sputtering) technique. Advantageously, the second layer is formed from one of the Cu—Ga target compositions discussed earlier in reference to FIG. 8. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$). At this point, the two layers have formed a metal precursor film as there will likely be some interdiffusion during the various forming steps. As discussed previously, the metal precursor film is advantageously Cu-poor so that the absorber material will exhibit p-type behavior.

In step 1606, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1608 illustrates an option anneal to allow the interdiffusion of In and Ga within the film as discussed previously. This step may be integrated in the chalcogenization process (e.g. step 1606 as discussed previously) or may be a separate step.

In some embodiments, a third layer that includes Ag is formed above the second layer before the chalcogenization step (e.g. between steps 1604 and 1606—not shown). The addition of Ag provides an additional mechanism for altering the bandgap grading and improving the performance of the device.

In some embodiments, the metal precursor film further includes Na. The Na may be added during any of the layer formation steps (i.e. steps 1602-1604—not shown) or may be added as a separate layer before the chalcogenization step as discussed previously.

Advantageously, the method illustrated in FIG. 16 excludes the purposeful addition or exposure of the metal precursor film to a source of S. As discussed previously, the addition of S complicates the chalcogenization of the metal precursor film and the formation of the chalcogenide material.

Figure 17:
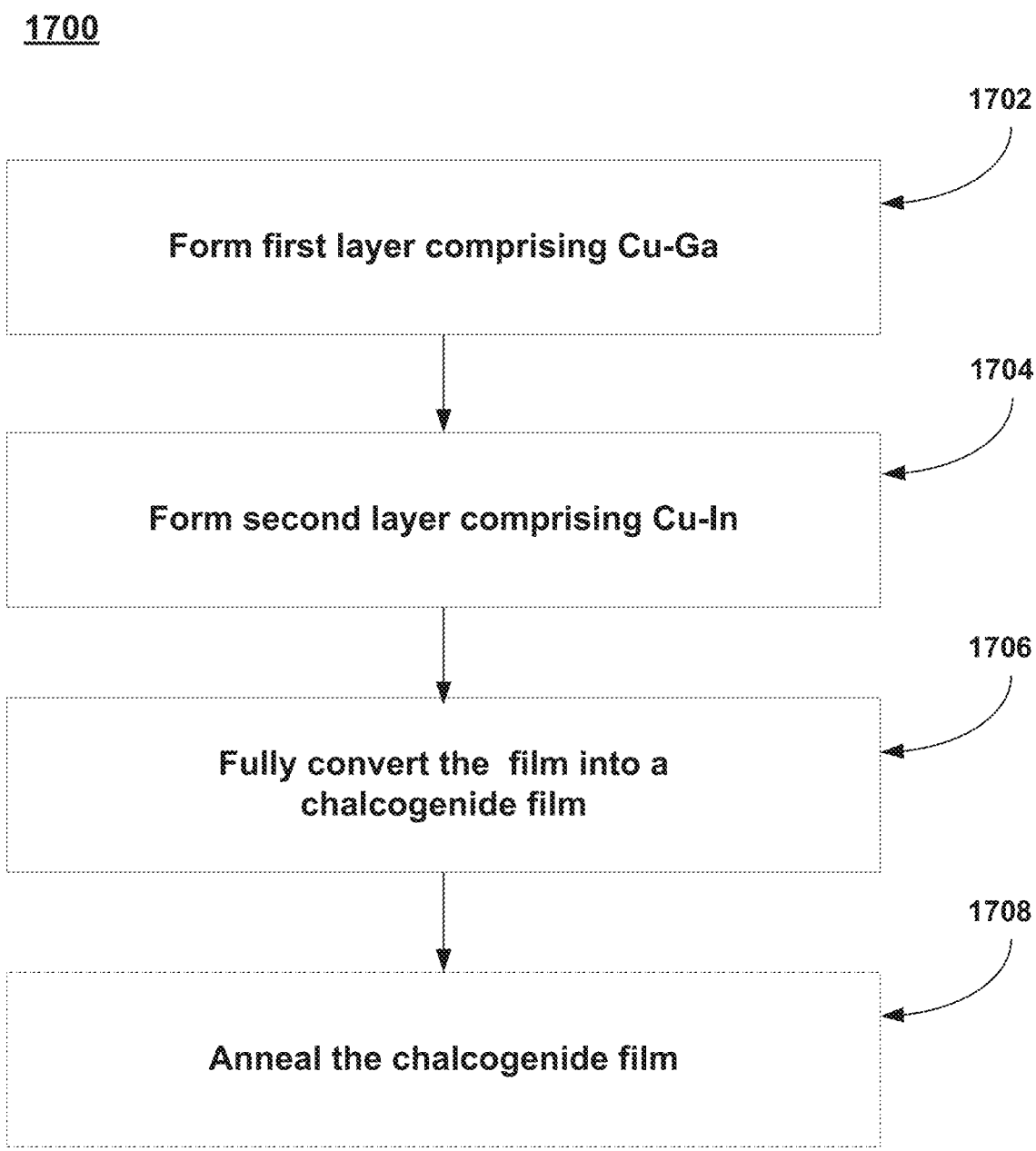
FIG. 17 is a flow chart for a method used to form an absorber material according to some embodiments.

FIG. 17 illustrates a flow chart, 1700, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1702, a first layer is formed above a surface of the substrate. In some embodiments, the first layer comprises Cu—Ga. The first layer may be formed by a batch or in-line PVD (sputtering) technique. Advantageously, the first layer is formed from one of the Cu—Ga target compositions discussed earlier in reference to FIG. 8. In some embodiments, the Ga content is greater than about 25 atomic %. In some embodiments, the target includes a Cu concentration of about 60 atomic % and a Ga concentration of about 40 atomic % (i.e. $Cu_{60}Ga_{40}$). In some embodiments, the target includes a Cu concentration of about 33.3 atomic % and a Ga concentration of about 66.6 atomic % (i.e. $Cu_1Ga_2$).

In step 1704, a second layer is formed the first layer. In some embodiments, the second layer comprises Cu—In. The second layer may be formed by any one of a variety of techniques. Examples of suitable techniques include batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions. In some embodiments, the second layer is formed using batch or in-line PVD (sputtering) technique wherein the sputtering target comprises an In content of greater than 50%. At this point, the two layers have formed a metal precursor film as there will likely be some interdiffusion during the various forming steps. As discussed previously, the metal precursor film is advantageously Cu-poor so that the absorber material will exhibit p-type behavior.

In step 1706, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1708 illustrates an option anneal to allow the interdiffusion of In and Ga within the film as discussed previously. This step may be integrated in the chalcogenization process (e.g. step 1706 as discussed previously) or may be a separate step.

In some embodiments, a third layer that includes Ag is formed above the second layer before the chalcogenization step (e.g. between steps 1704 and 1706—not shown). The addition of Ag provides an additional mechanism for altering the bandgap grading and improving the performance of the device.

In some embodiments, the metal precursor film further includes Na. The Na may be added during any of the layer formation steps (i.e. steps 1702-1704—not shown) or may be added as a separate layer before the chalcogenization step as discussed previously.

Advantageously, the method illustrated in FIG. 17 excludes the purposeful addition or exposure of the metal precursor film to a source of S. As discussed previously, the addition of S complicates the chalcogenization of the metal precursor film and the formation of the chalcogenide material.

Figure 18:
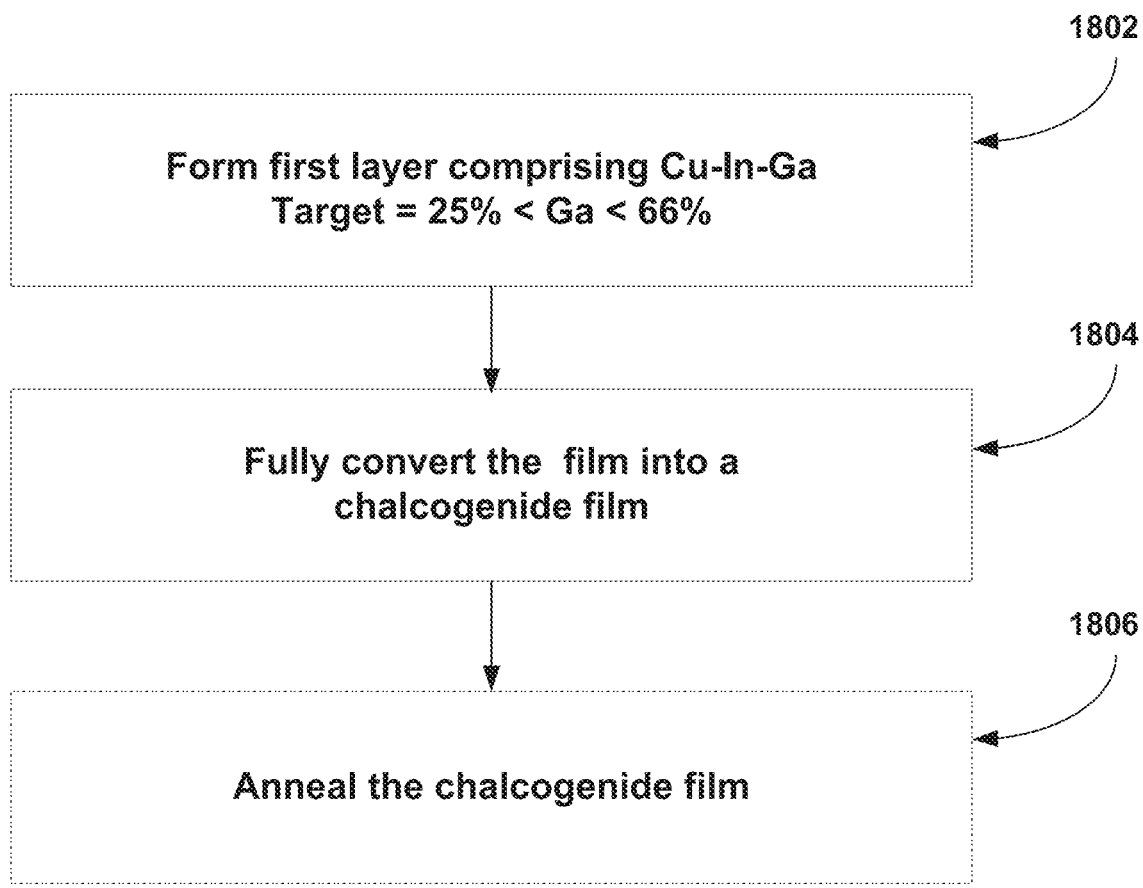
FIG. 18 is a flow chart for a method used to form an absorber material according to some embodiments.

FIG. 18 illustrates a flow chart, 1800, that describes methods of some embodiments of the present invention. The purpose of the method is to form a Group I-III-VI semiconductor material suitable for thin film solar cells on a substrate. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, in-line continuous processing, roll-to-roll processing, etc. Those skilled in the art will understand that the substrate will have been exposed to several previous processing steps and will have several layers formed thereon before this step in the manufacture of a solar cell.

In step 1802, a first layer is formed above a surface of the substrate. In some embodiments, the first layer comprises Cu—In—Ga. The first layer may be formed by a batch or in-line PVD (sputtering) technique. Advantageously, the first layer is formed from one of the Cu—In—Ga target compositions discussed earlier in reference to FIG. 8. In some embodiments, the Ga content in the target is between about 25 atomic % and about 66 atomic %. As discussed previously, the metal precursor film is advantageously Cu-poor so that the absorber material will exhibit p-type behavior. Therefore, if the Cu concentration in the target is too high, additional optional depositions may be required to adjust the Cu—In—Ga concentrations as discussed previously.

In step 1804, the metal precursor film is fully converted to a chalcogenide material. The converting step may be accomplished using one of a batch furnace, RTP system, or in-line system. In the case of a batch furnace, one of the furnace profiles as discussed with respect to FIGS. 11 and 12 may serve as an example of a suitable chalcogenization process.

Step 1806 illustrates an option anneal to allow the interdiffusion of In and Ga within the film as discussed previously. This step may be integrated in the chalcogenization process (e.g. step 1804 as discussed previously) or may be a separate step.

In some embodiments, a second layer that includes Ag is formed above the first layer before the chalcogenization step (e.g. after step 1802—not shown). The addition of Ag provides an additional mechanism for altering the bandgap grading and improving the performance of the device.

In some embodiments, the metal precursor film further includes Na. The Na may be added during any of the layer formation steps (i.e. step 1802—not shown) or may be added as a separate layer before the chalcogenization step as discussed previously.

Advantageously, the method illustrated in FIG. 18 excludes the purposeful addition or exposure of the metal precursor film to a source of S. As discussed previously, the addition of S complicates the chalcogenization of the metal precursor film and the formation of the chalcogenide material.

Illustrative Example

Cited References are Listed at the End $Cu(In_{1-x},Ga_x)Se_2$ (CIGSe) based solar cells were fabricated using a sulfur-free sequential process. Combinatorial sputtering of Cu, In, and Ga results in a broad range in Cu/(In+Ga), Ga/(In+Ga), and thickness within one sample, allowing an accelerated learning curve to form high quality CIGSe by selenization. A high Ga content at the CIGSe surface allows for high efficiency and $V_{oc}$. The structural and optoelectronic properties of the absorber were characterized by SIMS, XRF, SEM, XRD and PL. EQE results confirmed a high bandgap (~1.12 eV) of the absorber surface. $V_{oc}$ of 693 mV was achieved with best cell efficiency of 16.8%.

$Cu(In_{1-x},Ga_x)Se_2$ (CIGSe) based solar cells fabricated by the sequential (2-step) process for the CIG(S)Se absorber is a promising technology for large scale and low cost manufacturing of photovoltaic modules, as evidenced by Solar Frontier, and Avancis. In a typical sequential process, the Cu(In, Ga) metal precursors are deposited by sputtering, followed by chalcogenization in a Se and/or S (sulfur) containing environment. The main challenge to form high efficiency CIGSe via a sequential process is the segregation of gallium towards the back of the CIGSe film [1]. This limits the efficiency and $V_{oc}$ of the solar cell, since the most active region of the absorber acts like the narrow bandgap CISe (without gallium).

A common strategy to resolve the lack of Ga at the absorber surface is the incorporation of sulfur by a post-sulfurization process to increase the bandgap at the absorber surface [2]. One of the first companies to use this strategy was ARCO, later Siemens, later Shell Solar Industries (CA, USA), with Shell Munich (now Avancis), and Showa Shell Sekiyu (now Solar Frontier) following a similar strategy. However, the processing complexity increases substantially with the addition of sulfur, and additional homogeneity challenges arise from adding a fifth element to the already complex quaternary CIGSe alloy.

In this study, we report the fabrication of high quality CIGSe absorbers by the optimization of the sputtered precursor in combination with the selenization conditions. The resulting solar cell showed high efficiency with high $V_{oc}$ at the level of world record cells made by 3-stage co-evaporation for CIGSe [3], and sequential processing for sulfur-containing CIGSSe [4].

The Mo-coated soda lime glass substrates were purchased from a commercial vendor (Guardian Industries). The substrates were cut into 13.0 cm by 6.5 cm rectangles and cleaned with detergent solution, then blown dry with $N_2$ prior to precursor deposition.

The precursors were deposited in an Intermolecular Tempus™ P-30 HPC™ sputtering tool that allows the simultaneous use of 4 different targets for co- and/or sequential sputtering of Cu, In, and Ga with systematically controlled lateral gradients in composition and thickness within one substrate. The ranges of film thickness and composition could be accurately controlled by semi-empirical PVD modeling. The film thickness range was 450-600 nm with composition range of Cu/(In+Ga)=0.8-1.0, and Ga/(Ga+In)=0.30-0.45.

Selenization of the Cu(In,Ga) metal precursors with $H_2Se$/Ar was carried out in a commercial quartz furnace customized for safety. The selenization process was optimized to achieve high quality CIGSe crystals with a backside graded Ga profile.

Structure of the CIGSe absorber was investigated by X-ray diffraction (XRD) with Cu $K_\alpha$ radiation. Surface morphology and grain size were observed by scanning electron microscopy (SEM). The composition was determined by X-ray fluorescence (XRF). Compositional depth profile was determined by Secondary Ion Mass Spectrometry (SIMS) using $Cs^+$ primary beam in positive detection mode. Optoelectronic quality and surface bandgap was investigated by spectrally resolved room temperature photoluminescence (PL) with a 660 nm solid state laser. The spot size was about 1 mm in diameter. PL spectra were taken near the center of the cells. For usefulness of PL, see references [5-7].

The complete solar cells included a buffer layer of ~50 nm CdS deposited by chemical bath deposition (CBD) in a beaker, followed by a double layer (high resistivity/low resistivity) of (pulse) DC sputtered ZnO:Al in a commercial PVD sputtering tool. The thickness of the i-ZnO and ZnO:Al layers were about 50 nm and 500 nm, respectively. The resistivity of the ZnO:Al film was $1.4\times10^{-3}$ Ωcm. Ni/Al front contacts were deposited by e-beam evaporation in a CHA evaporator through a shadow mask. The thickness of the Ni and Al layers were 50 nm and 3 μm, respectively. Back contact was formed by In soldering on exposed Mo after mechanical removal of the top layers. No anti-reflection coatings were used. The finished cells were about 0.5 cm by 1.0 cm. Precise cell area and grid shadow area were determined by taking photos of the cells with high resolution camera and image analysis. J-V measurements were performed in a Newport Oriel Solar Simulator automated by Intermolecular for fast JV measurements on multiple cells. Test condition was simulated air mass 1.5 global (AM1.5G, 100 mW/cm$^2$) at room temperature. The results were analyzed using a one-diode model according to the equation:

$$J = J_0\left[\exp\left(\frac{q(V-R_iJ)}{AkT}\right)-1\right]+\frac{(V-R_iJ)}{R_{ih}}-J_L \quad (1)$$

The J-V parameters were extracted using an analytical method [8] and the dV/dJ vs $(J+J_L)^{-1}$ method [9]. QE was measured on an Oriel model IQE-200 with a quartz tungsten halogen lamp and monochromator with chopper running at 30 Hz. The spot size was 1 mm×2.5 mm rectangular. The QE system was automated by Intermolecular for fast EQE measurements on multiple cells.

Figure 19:
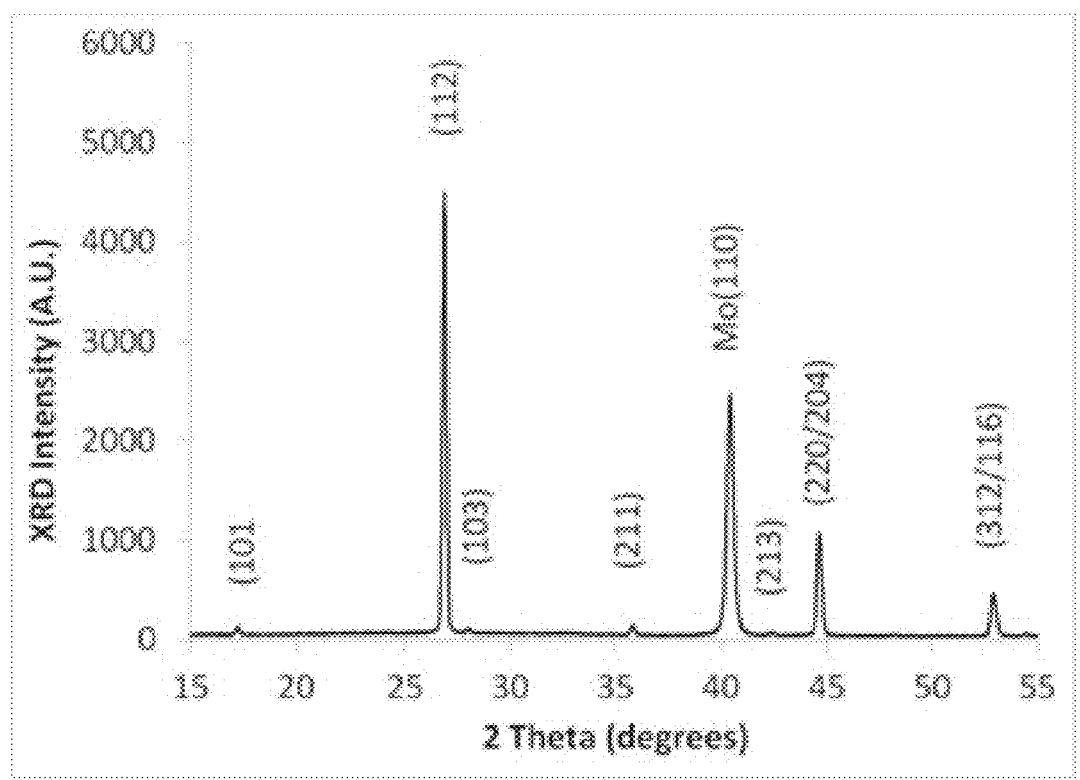
FIG. 19 presents XRD data for a CIGSe absorber according to some embodiments.
Figure 20:
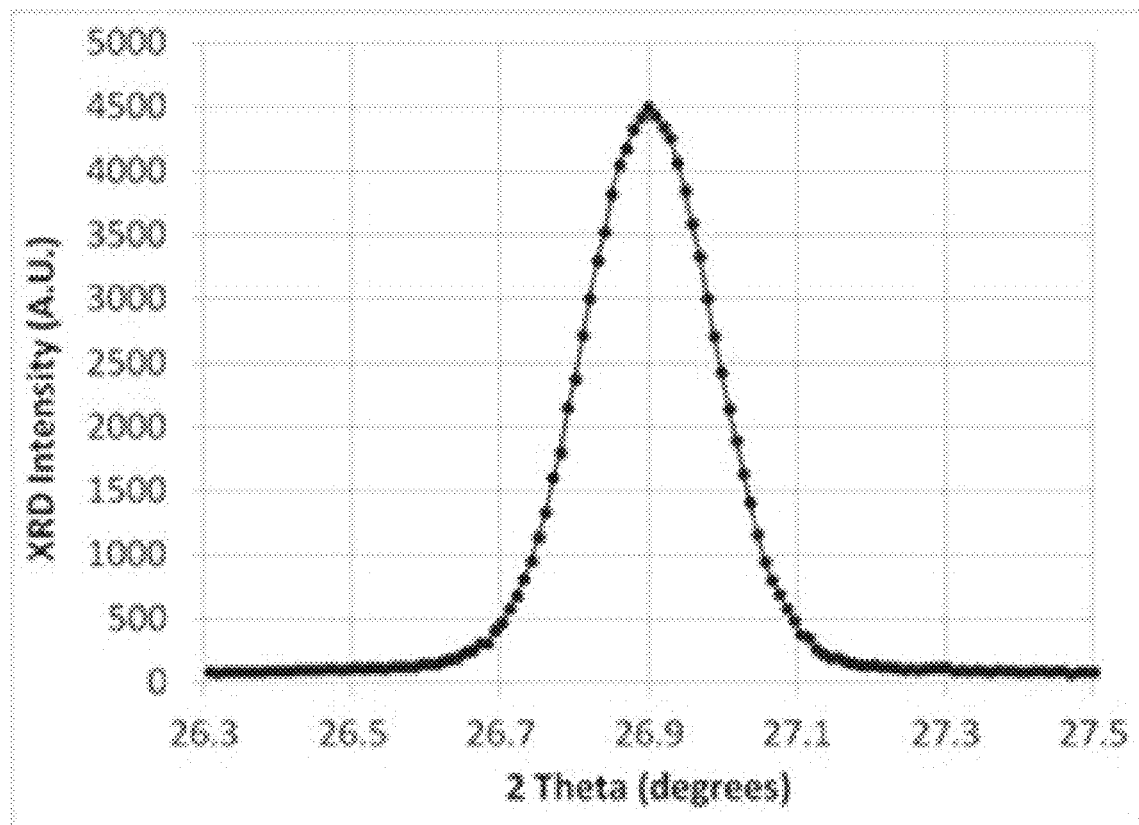
FIG. 20 presents XRD data for a CIGSe absorber according to some embodiments.

Structural and phase information of the absorber was investigated by XRD in the standard θ/2θ scan configuration (FIGS. 19, and 20). XRD pattern of the absorber showed only the chalcopyrite phase. No extra peaks from minority secondary phases were observed. The diffraction intensity ratio of (112) peak to (220) peak was about 4:1. The absorber showed preferred orientation in the (112) direction compared to JCPDS powder standard of Cu(Ga$_{0.3}$,In$_{0.7}$)Se$_2$ (ratio 2.5:1). The FWHM of the main (112) peak was about 0.21 degrees. The narrow FWHM indicated high crystal quality and good spatial compositional uniformity. The absorber showed a fairly symmetrical XRD peak (FIG. 13), in contrast to the typical high-angle shoulder resulting from excessive gallium segregation to the back.

Figure 21:
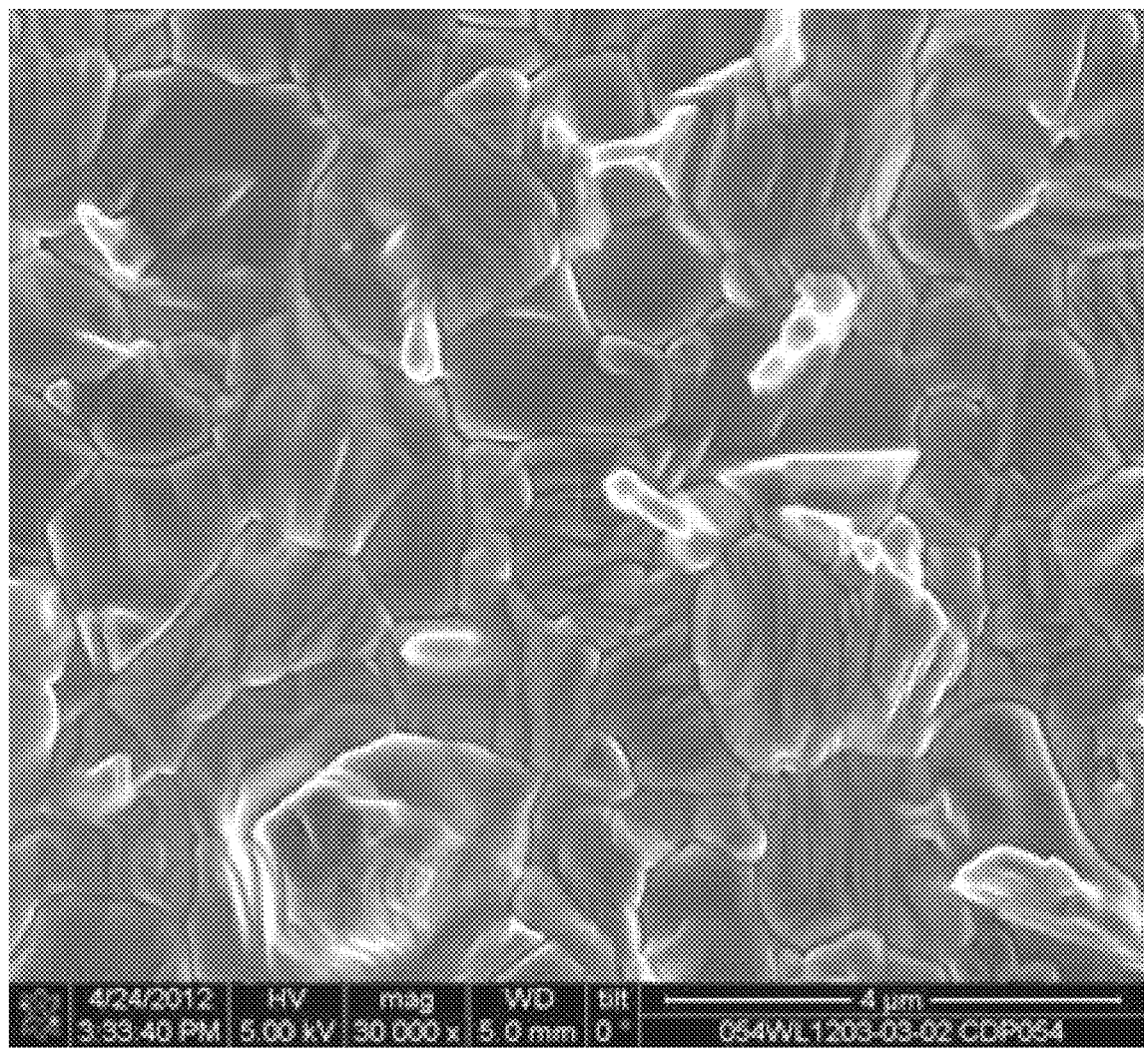
FIG. 21 presents SEM data for a CIGSe absorber according to some embodiments.
Figure 22:
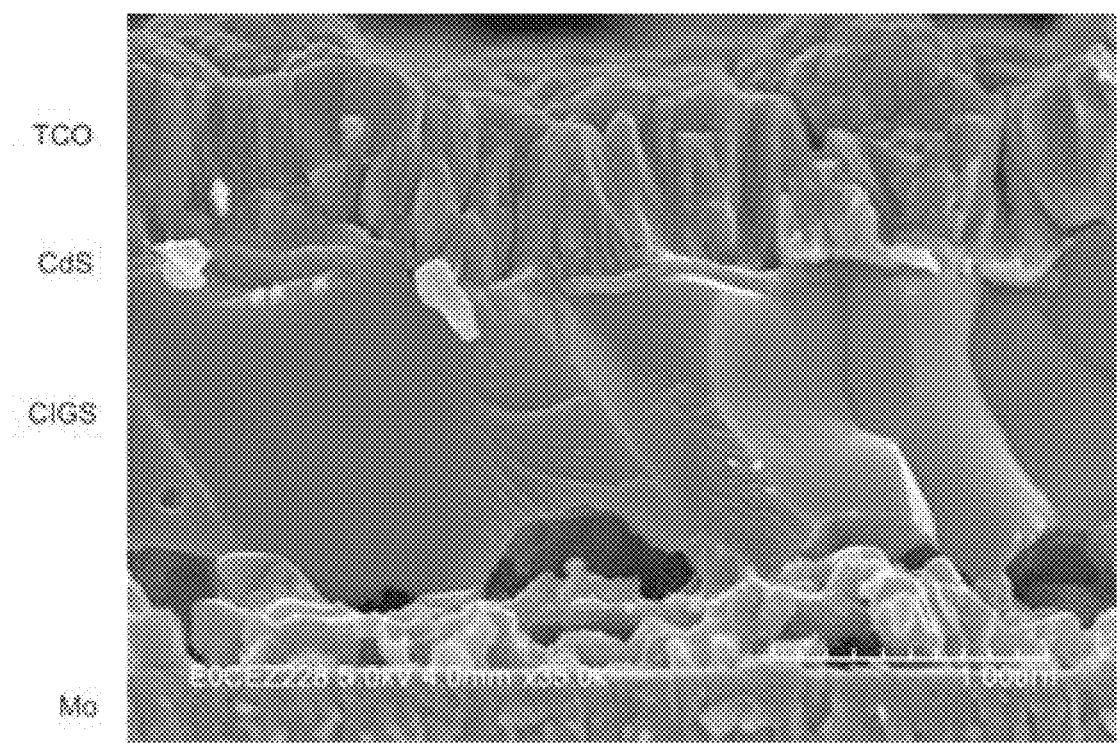
FIG. 22 presents SEM data for a CIGSe absorber according to some embodiments.

Plan view SEM (FIG. 21) of the absorber showed well defined grains larger than 1 μm in size. The grains were densely packed. Cross-sectional SEM imaging (FIG. 22) of fractured cells showed a two layer structure in the absorber. The top layer contained well facetted and large columnar CIGSe grains greater than 1 μm in size. The large grain size is typically a signature of high quality material [10]. The bottom layer near the Mo interface contained many voids and small grains, which indicated the possible existence of a separate phase. The voids are typical for sequential processing using $H_2Se$. CdS thickness measured by SEM was about 50 nm. TCO thickness was about 500 nm. The relatively large thickness of the TCO indicated cell efficiency can be further improved by optimizing TCO thickness.

Figure 23:
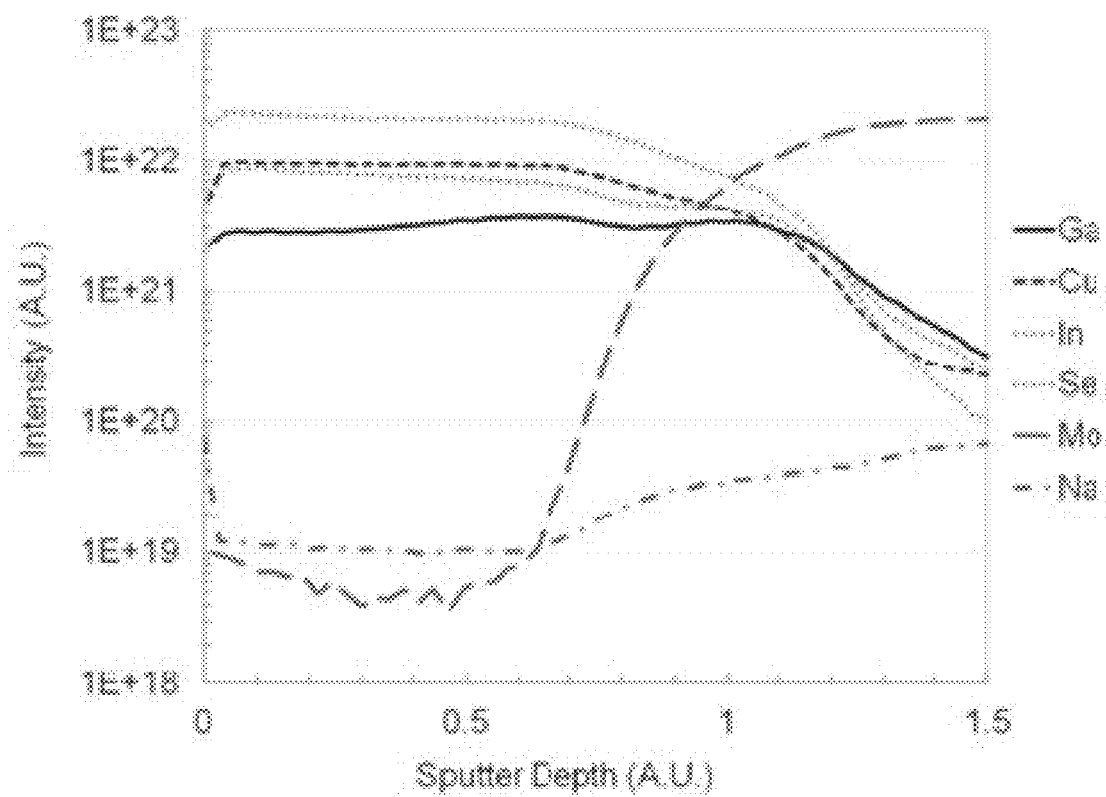
FIG. 23 presents SIMS data for a CIGSe absorber according to some embodiments.

SIMS compositional depth profile (FIG. 23) showed slightly graded Ga profile towards the back contact. The Ga profile indicated the selenization process was effective in resolving the excessive Ga segregation problem commonly seen in sequential (2-step) processes [1]. A small back side grading is believed to be beneficial for enhanced minority carrier collection.

Figure 24:
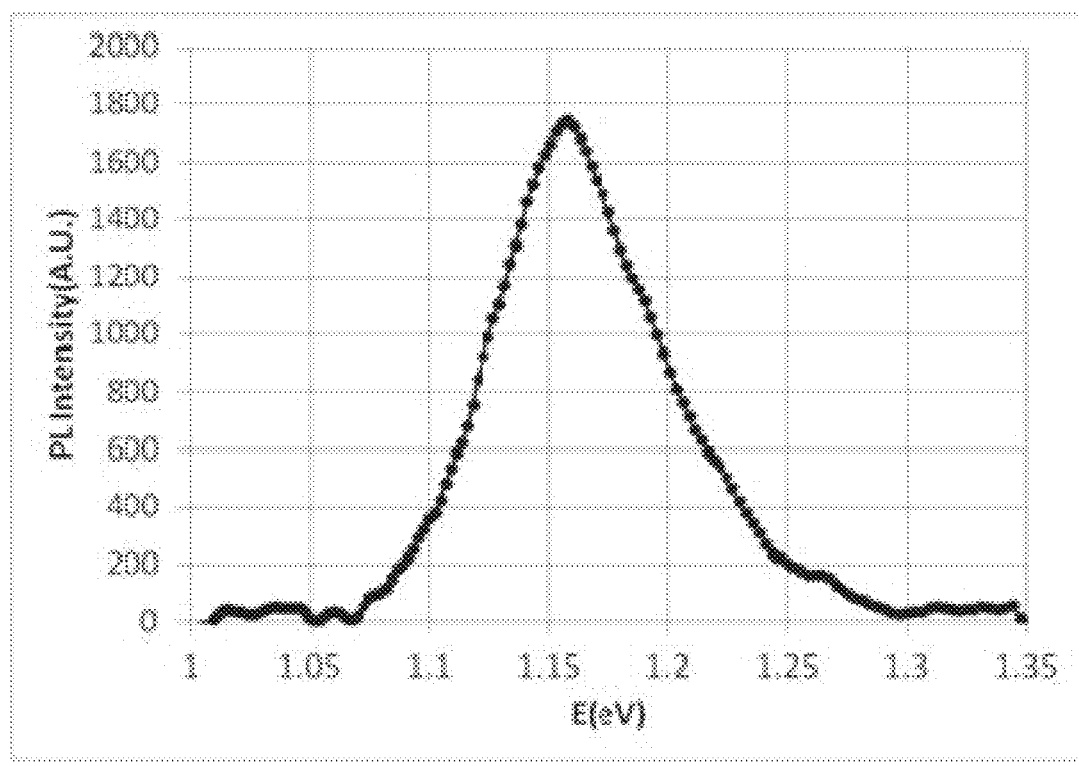
FIG. 24 presents PL data for a CIGSe solar cell according to some embodiments.
Figure 25:
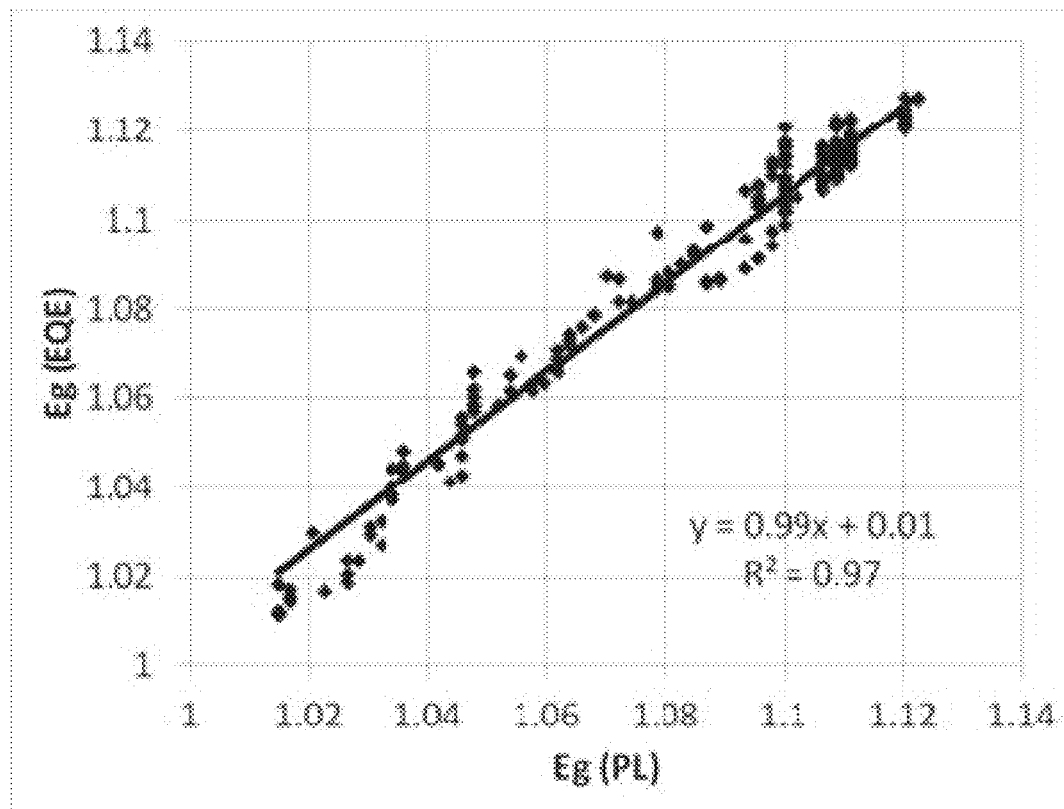
FIG. 25 presents bandgap data for a CIGSe absorber according to some embodiments.
Figure 26A:
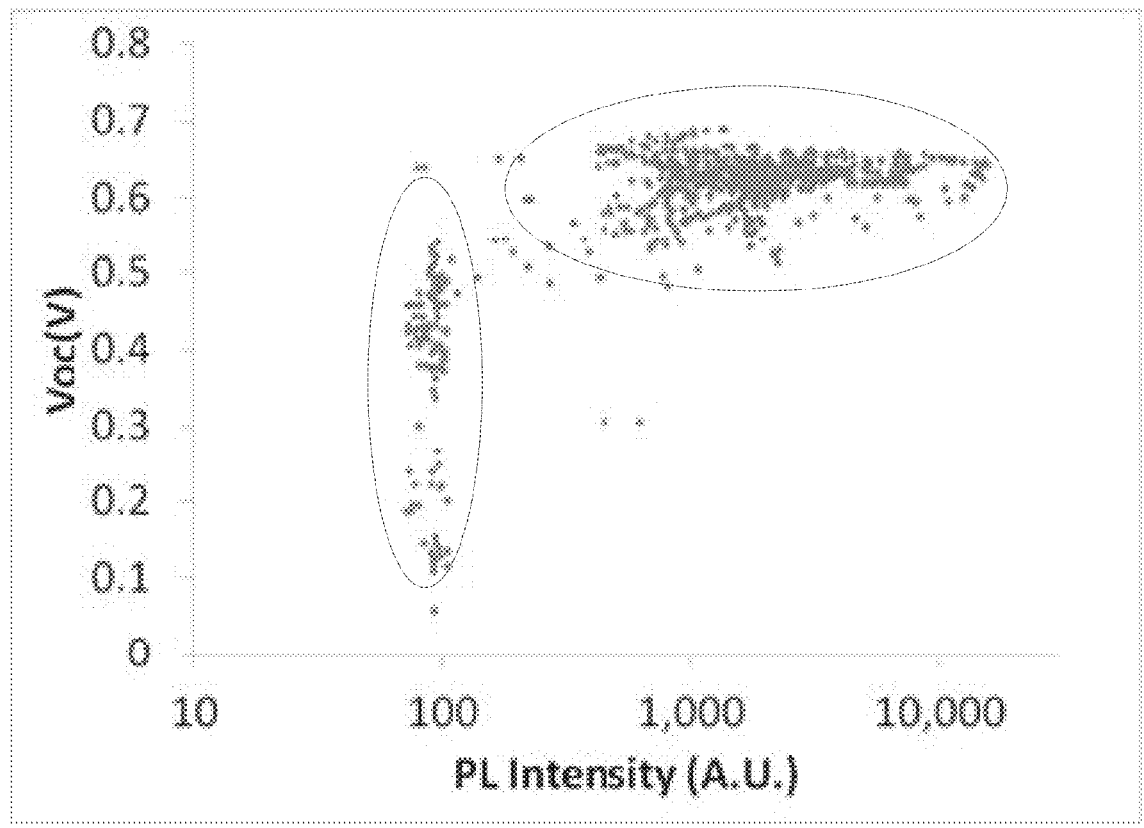
FIGS. 26A-26D presents PL yield vs I-V parameters data for a CIGSe solar cell according to some embodiments.
Figure 26B:
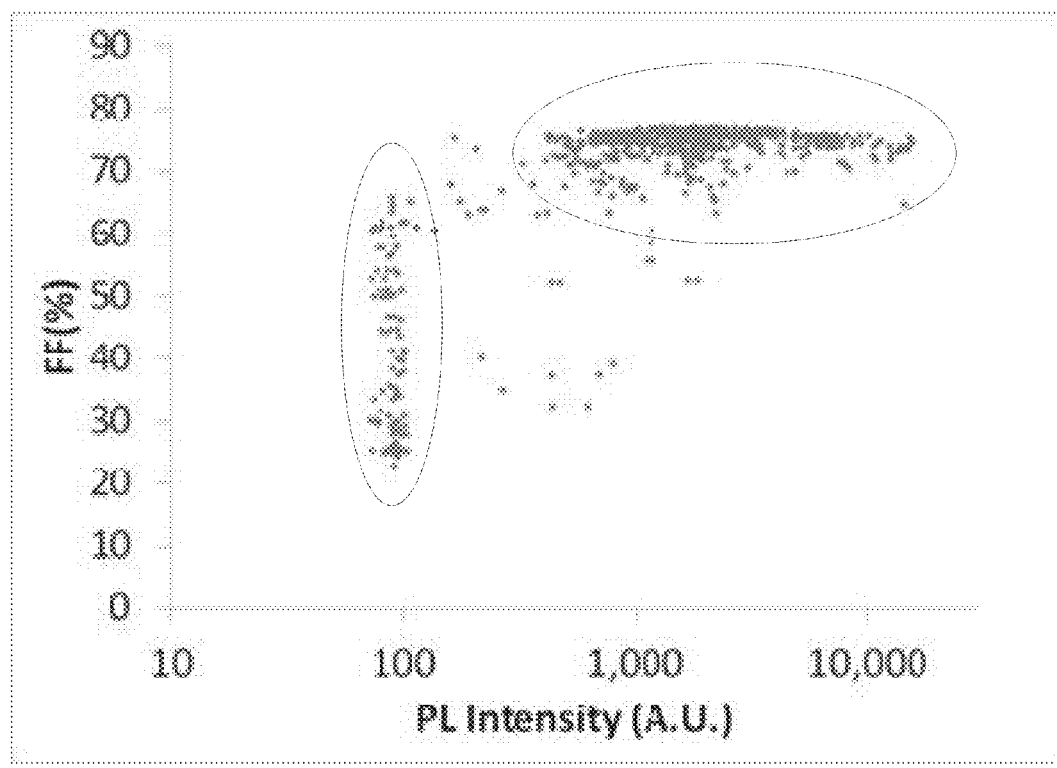
Figure 26C:
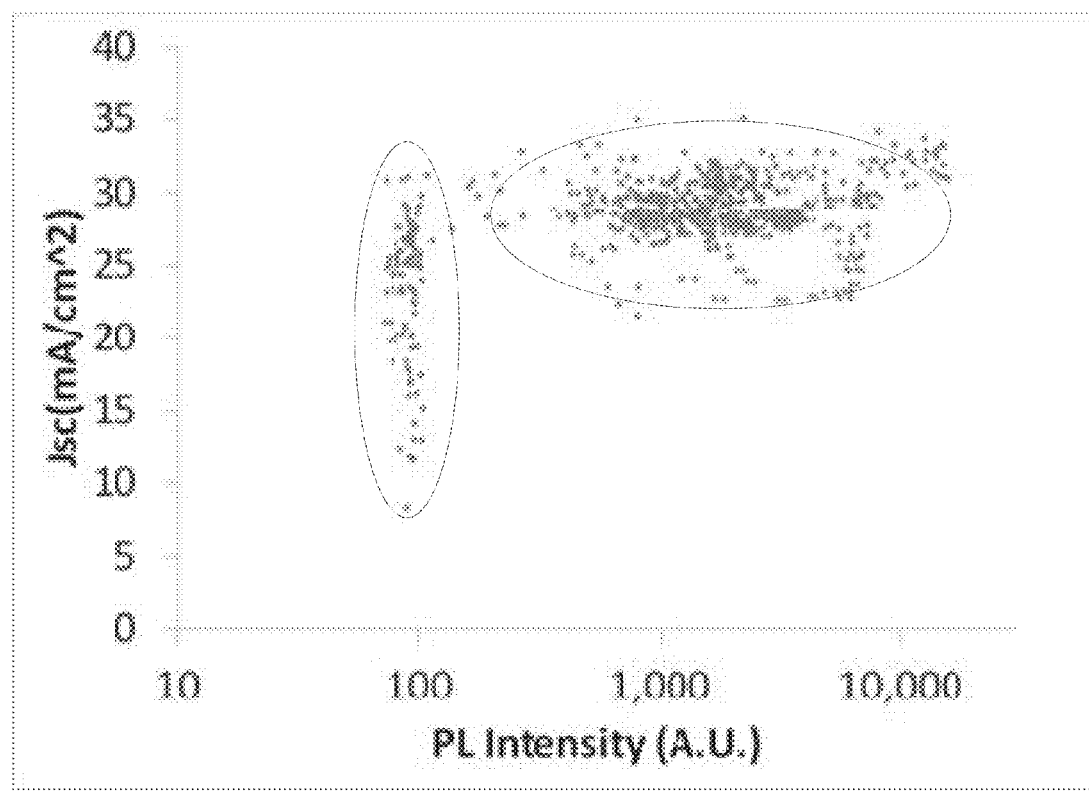
Figure 26D:
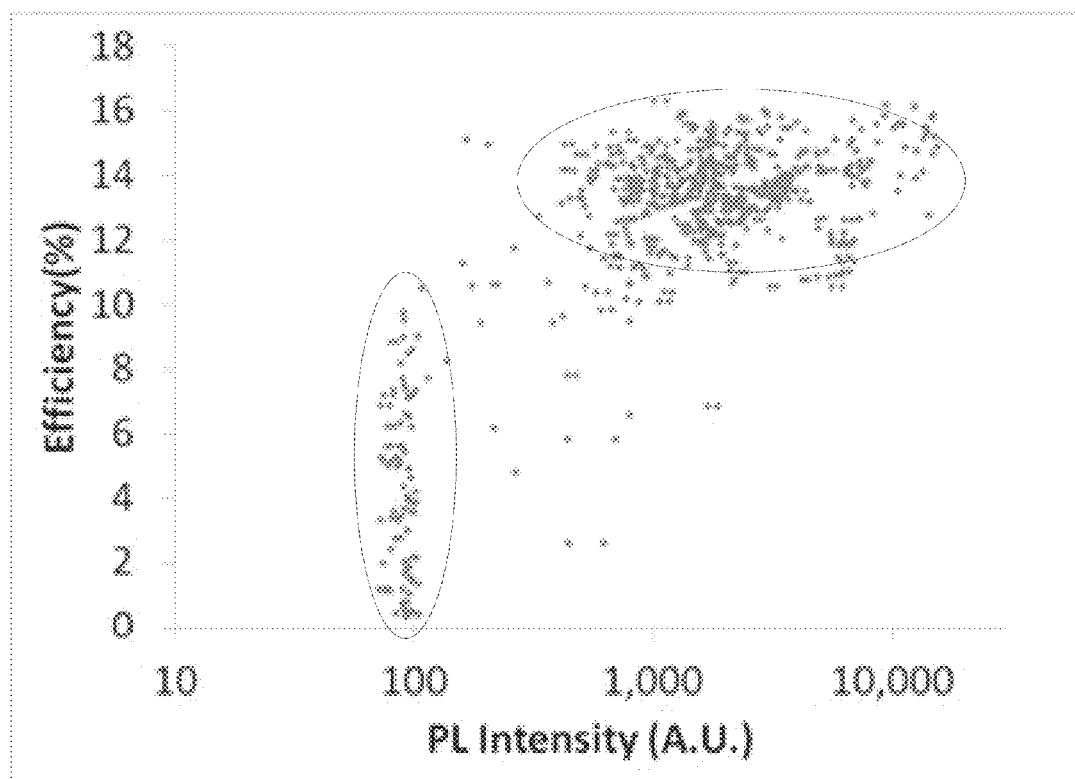

Room temperature photoluminescence (PL) spectroscopy (FIG. 24) showed a peak position of 1.16 eV in the near band edge PL spectrum believed to be mainly due to band-to-band transition. The FWHM of the main peak was 0.08 eV. Because our CIGSe absorber has a graded band structure, it was hard to define the bandgap. The PL peak position can be regarded as the estimated average bandgap of the absorber in the probe depth of the incident laser plus carrier diffusion length, see references [5-7]. The bandgap extracted from the PL spectra was plotted against the bandgap from external quantum efficiency at 20% EQE in FIG. 25. Very good correlation was obtained between the two different measurements of bandgap in the material range we investigated.

PL yield is a measure of radiative recombination rate given by [5], and [11]:

$$dj_\gamma(\hbar\omega) = a(\hbar\omega)\frac{\Omega}{4\pi^3\hbar^3e^2}\frac{(\hbar\omega)^2 d\hbar\omega}{\exp\left[\frac{\hbar\omega-(E_{FC}-E_{FV})}{kT}\right]-1} \quad (2)$$

Where $j_\gamma$ is the photocurrent emitted into the solid angle Ω, $\hbar\omega$ is the photon energy, a is the absorbance, c is the speed of light, and $E_{FC}$-$E_{FV}$ is the splitting of quasi-fermi levels. Since the splitting of quasi-fermi levels corresponds to the maximum $V_{oc}$, PL yield may potentially be useful as a metrology of the quality of the absorber. In FIGS. 26A-26D, we plotted PL yield intensity vs. the I-V parameters for a wide range of cells with different cell efficiencies. Two distinct regions can be discerned: a low PL region where the cell efficiency was less than about 10%, and a high PL region where the cell efficiency was greater than 10%. The low efficiency cells could be caused by detrimental effects such as shunting, binary phase formation, or defects, which led to low PL yield. For higher efficiency cells, more subtle effects such as homogeneity, bandgap grading, and interface effects become increasingly important, see references [5-7], and PL intensity at a single spot of the cell was not sufficient to indicate cell efficiency. The outliers in the plot may be other effects such as local shunts or adhesion problems, which could not be detected by PL at a single spot of the cell.

Figure 27:
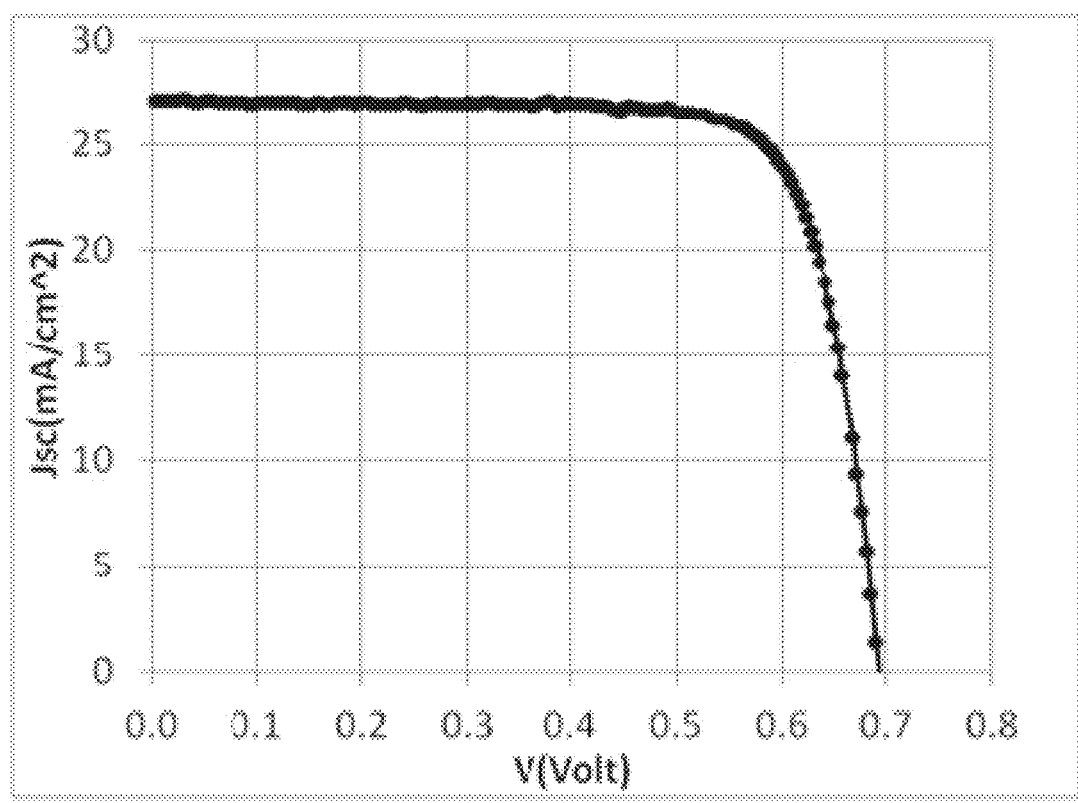
FIG. 27 presents J-V data for a CIGSe solar cell according to some embodiments.

The J-V plot and diode parameters of the best cell are shown in FIG. 27 and Table 1 (FIG. 28) (active area of 0.435 cm$^2$ with no anti-reflection coating). The conversion efficiency is one of the best in sulfur-free sequential processing. The $V_{oc}$ is at the level of world record CIGSe cells by 3-stage co-evaporation [3], and sulfur-containing sequential processing [4]. The high $V_{oc}$ resulted from the low saturation current and diode quality factor.

Figure 29:
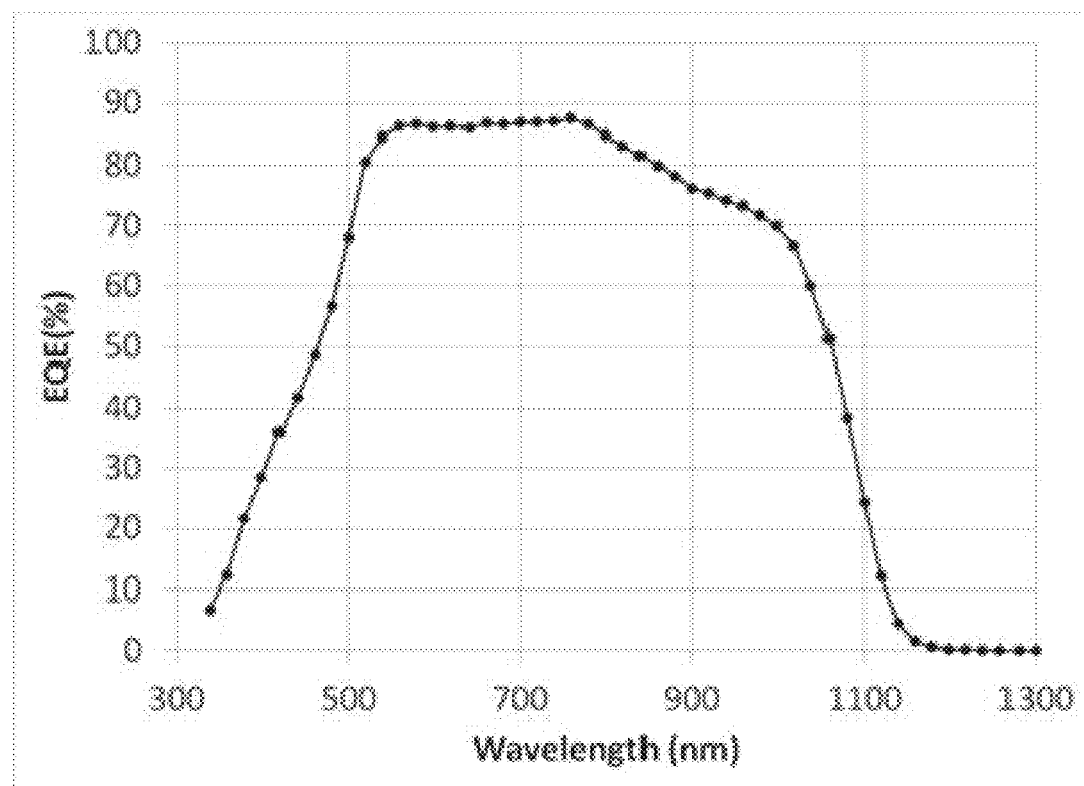
FIG. 29 presents EQE data for a CIGSe solar cell according to some embodiments.

The external quantum efficiency curve of the best cell is shown in FIG. 29. Low EQE at <500 nm indicates the efficiency can be further improved by optimizing CdS and/or TCO. The drop in EQE at wavelength >750 nm can be due to poor carrier collection, incomplete light absorption of the absorber, or further need of TCO optimization.

Figure 30:
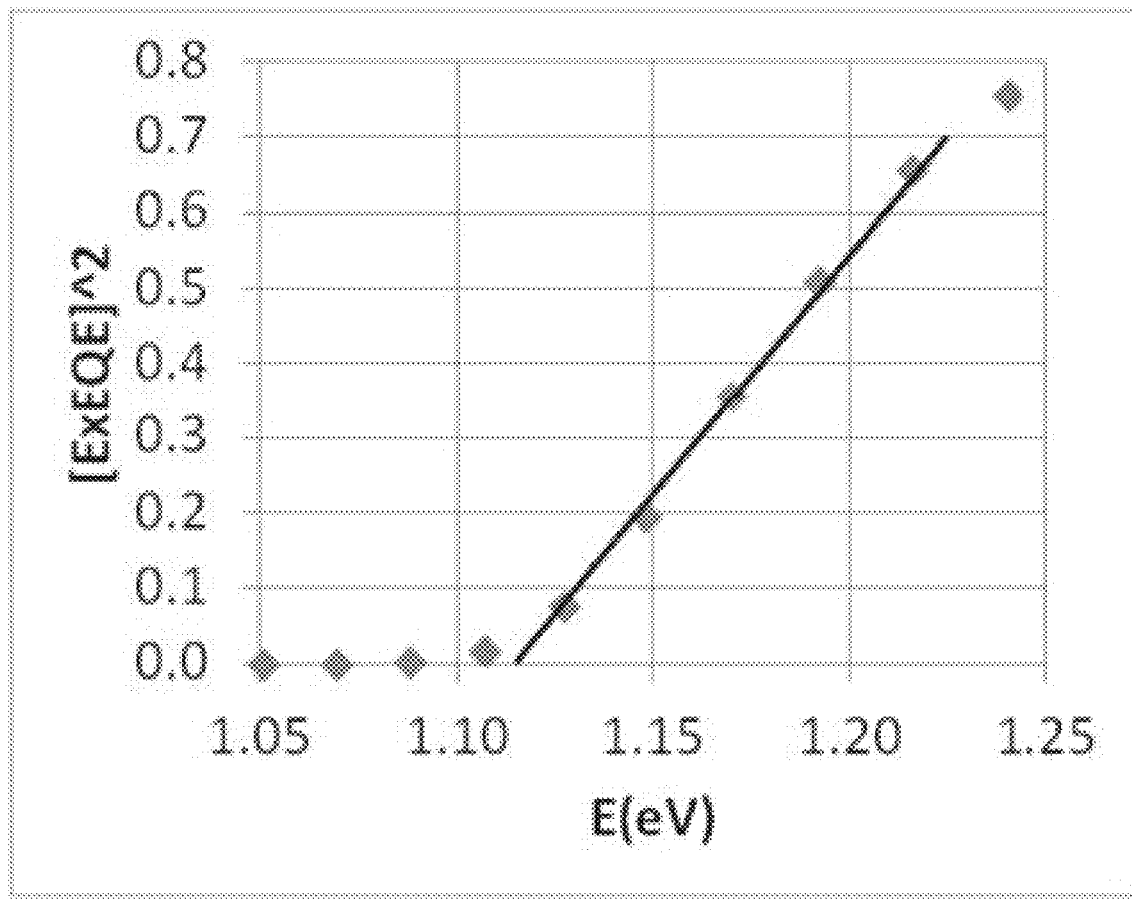
FIG. 30 presents bandgap extraction data for a CIGSe solar cell according to some embodiments.

Bandgap of the absorber was extracted from EQE (FIG. 30) by taking the x-axis intercept of $[ExEQE]^2$ vs. E [12]. EQE showed the bandgap at about 1.12 eV. An alternative method was simply to take the value at EQE=20% of the long wavelength edge, which yielded the same bandgap value of 1.12 eV. These results were similar to bandgap extracted from PL (1.16 eV). $E_g$ vs $V_{oc}$ values of the best cell compares well with world record cells, with $E_g/q-V_{oc}$=427 mV [13].

CIGSe solar cells were fabricated by optimizing the combination of the sputtered Cu(In,Ga), and selenization conditions. SEM, XRD, SIMS and PL analysis confirm the formation of high quality CIGSe absorber with high Ga level at the front surface. The effectiveness of PL as a metrology for absorber quality and bandgap measurement was investigated. EQE provides a bandgap at the surface of about 1.12 eV. High $V_{oc}$ of 693 mV and efficiency of 16.8% (active area, no anti-reflection coating) was achieved on the best solar cell.

References cited in the illustrative example:

[1] G. M. Hanket, W. N. Shafarman, B. E. McCandless, and R. W. Birkmire, "Incongruent reaction of Cu—(InGa) intermetallic precursors in H$_2$Se and H$_2$S", *J. Appl. Phys.* 102 (2007), pp. 074922-1-074922-10.

[2] Y. Goushi, H. Hakuma, K. Tabuchi, S. Kijima, and K. Kushiya, "Fabrication of pentanary Cu(InGa)(SeS)$_2$ absorbers by selenization and sulfurization", *Solar Energy Materials & Solar Cells* 93 (2009), pp. 1318-1320.

[3] I. Repins, M. Contreras, M. Romero, Y. Yan, W. Metzger, J. Li, S. Johnston, B. Egaas, C. DeHart, and J. Scharf, "Characterization of 19.9%-efficient CIGS absorbers", 33$^{rd}$ *IEEE Photovoltaic Specialist Conference,* 2008, pp. 1-6.

[4] H. Sugimoto, Y. Kawaguchi, Y. Yasaki, T. Aramoto, Y. Tanaka, H. Hakuma, S. Kuriyagawa, and K. Kushiya, "Challenge to 18% efficiency with 30×30 cm$^2$-sized Cu(InGa)(SeS)$_2$ submodules in Solar Frontier", 26$^{th}$ *European Photovoltaic Solar Energy Conference,* 2011, pp. 2307-2310.

[5] L. Gutay, and G. H. Bauer, "Non-uniformities of optoelectronic properties in Cu(In,Ga)Se$_2$ thin films and their influence on cell performance studied with confocal photoluminescence", 34$^{th}$ *IEEE Photovoltaic Specialist Conference,* 2009, pp. 000874-000877.

[6] S. W. Johnston, T. Unold, I. Repins, R. Sundaramoorthy, K. M. Jones, B. To, N. J. Call, and R. K. Ahrenkiel, "Imaging characterization techniques applied to Cu(In,Ga)Se$_2$ solar cells", *Journal of Vacuum Science and Technology A: Vacuum, Surfaces, and Films* 28 (2010), pp. 665-670.

[7] H. Sugimoto, T. Aramoto, Y. Kawaguchi, Y. Chiba, S. Kijima, Y. Fujiwara, Y. Tanaka, H. Hakuma, K. Kakegawa, and K. Kushiya, "Impact of Cu(InGa)(SeS)$_2$ absorber quality and circuit uniformity on improved efficiency; application of photoluminescence and electroluminescence technique", 24*th European Photovoltaic Solar Energy Conference,* 2009, pp. 21-25.

[8] J. Phang, D. Chan, and J. Phillips, "Accurate analytical method for the extraction of solar cell model parameters". *Electronics Letters* 20 (1984), pp. 406-408.

[9] J. R. Sites, P. H. Mauk, "Diode quality factor determination for thin-film solar cells", *Solar Cells* 27 (1989), pp. 411-417.

[10] G. Sozzi, F. Troni, and R. Menozzi, "Numerical analysis of the effect of grain size and defects on the performance of CIGS solar cells", *Proceedings CSMANTECH Conference,* 2010, pp. 353-356.

[11] P. Würfel, *Physics of Solar Cells,* Wiley-VCH, Weinheim—F. R. G., 2005.

[12] T. K. Todorov, O. Gunawan, T. Gokmen and D. B. Mitzi, "Solution-processed Cu(In,Ga)(S,Se)$_2$ absorber yielding a 15.2% efficient solar cell," *Prog. Photovolt: Res. Appl.* (2012), article in press.

[13] M. A. Contreras, L. M. Mansfield, B. Egaas, J. Li, M. Romero, R. Noufi, E. Rudiger-Voigt, and W. Mannstadt, "Improved energy conversion efficiency in wide-bandgap Cu(In,Ga)Se$_2$ solar cells", 37$^{th}$ *IEEE Photovoltaic Specialist Conference,* 2011.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a semiconductor material on a substrate, the method comprising:
    forming a metal precursor film, wherein forming the metal precursor film comprises:
        i. forming a first layer above a surface of the substrate, wherein the first layer comprises Cu and Ga, and wherein the first layer is formed using a sputtering process from a sputtering target comprising between about 25 atomic % Ga and about 66 atomic % Ga;
        ii. forming a second layer above the first layer, wherein the second layer comprises In;
        iii. forming a third layer above the second layer, wherein the third layer comprises Cu; and
    heating the metal precursor film in the presence of a chalcogen at a temperature between 100 C and 700 C.

2. The method of claim 1 wherein the heating step comprises:
    heating the substrate and the metal precursor film to a temperature between 300 C and 400 C in an atmosphere comprising 1 molar % of the chalcogen;
    heating the substrate and the metal precursor film to a temperature between about 400 C and 550 C in an atmosphere comprising 1 molar % of the chalcogen; and
    heating the substrate and the metal precursor film to a temperature between about 550 C and 650 C in an atmosphere comprising 1 molar % of the chalcogen.

3. The method of claim 2 wherein the heating step is performed in a batch system.

4. The method of claim 2 wherein the heating step is performed in an in-line system.

5. The method of claim 1 wherein the sputtering target has a composition of about 60% atomic percent Cu and about 40 atomic % Ga.

6. The method of claim 1 wherein the sputtering target has a composition of about 33.3% atomic percent Cu and about 66.6 atomic % Ga.

7. The method of claim 1 further comprising forming a fourth layer above the third layer before the heating step, the fourth layer comprising Ag.

8. The method of claim 1 wherein the metal precursor film further comprises Na.

9. The method of claim 1 wherein the semiconductor material comprises less than about 10% sulfur.

10. The method of claim 1 wherein the second and third layers are each formed by a process comprising one of batch or in-line (co)evaporation, batch or in-line PVD (sputtering), ALD, CVD, Plasma enhanced CVD (PECVD), Plasma enhanced ALD (PEALD), atmospheric pressure CVD (APCVD), ultra-fast atmospheric ALD, plating, printing or spraying of inks, screen printing, inkjet printing, slot die coating, gravure printing, or wet chemical depositions.

11. A method for forming a semiconductor material on a substrate, the method comprising:
   forming a metal precursor film, wherein forming the metal precursor film comprises:
      i. forming a first layer above a surface of the substrate, wherein the first layer comprises Cu and In, and wherein the first layer is formed using a sputtering process from a first sputtering target comprising more than 50% In;
      ii. forming a second layer above the first layer, wherein the second layer comprises Cu, and Ga, and wherein the second layer is formed using a sputtering process from a second sputtering target comprising between about 25 atomic % Ga and about 66 atomic % Ga; and
   heating the metal precursor film in the presence of a chalcogen at a temperature between 100 C and 700 C.

12. The method of claim 11 wherein the heating step comprises:
   heating the substrate and the metal precursor film to a temperature between about 300 C and 400 C in an atmosphere comprising 1 molar % of the chalcogen;
   heating the substrate and the metal precursor film to a temperature between about 400 C and 550 C in an atmosphere comprising 1 molar % of the chalcogen; and
   heating the substrate and the metal precursor film to a temperature between about 550 C and 650 C in an atmosphere comprising 1 molar % of the chalcogen.

13. The method of claim 12 wherein the heating step is performed in a batch system.

14. The method of claim 12 wherein the heating step is performed in an in-line system.

15. The method of claim 11 wherein the second sputtering target has a composition of about 60% atomic percent Cu and about 40 atomic % Ga.

16. The method of claim 11 wherein the second sputtering target has a composition of about 33.3% atomic percent Cu and about 66.6 atomic % Ga.

17. The method of claim 11 further comprising forming a third layer above the second layer before the converting step, the third layer comprising Ag.

18. The method of claim 11 wherein the metal precursor film further comprises Na.

19. The method of claim 11 wherein the semiconductor material comprises less than about 10% sulfur.

* * * * *